(12) United States Patent
Silver et al.

(10) Patent No.: US 7,649,496 B1
(45) Date of Patent: Jan. 19, 2010

(54) EM RECTIFYING ANTENNA SUITABLE FOR USE IN CONJUNCTION WITH A NATURAL BREAKDOWN DEVICE

(76) Inventors: Guy Silver, 1071 Lackawanna Ct., Sunnyvale, CA (US) 94087; Juinerong Wu, 1071 Lackawanna Ct., Sunnyvale, CA (US) 94087

( * ) Notice: Subject to any disclaimer, the term of this patent is extended or adjusted under 35 U.S.C. 154(b) by 0 days.

(21) Appl. No.: 10/963,357

(22) Filed: Oct. 12, 2004

(51) Int. Cl.
*H01Q 1/38* (2006.01)
(52) U.S. Cl. .............................................. 343/700 MS
(58) Field of Classification Search ........... 343/700 MS
See application file for complete search history.

(56) References Cited

U.S. PATENT DOCUMENTS

| | | | |
|---|---|---|---|
| 3,434,678 A * | 3/1969 | Heenan et al. | 244/158.1 |
| 4,278,986 A | 7/1981 | Mader | |
| 4,901,120 A | 2/1990 | Weaver et al. | |
| 5,153,583 A * | 10/1992 | Murdoch | 340/10.34 |
| 5,629,544 A | 5/1997 | Voldman et al. | |
| 6,127,799 A * | 10/2000 | Krishnan | 320/104 |
| 6,369,759 B1 * | 4/2002 | Epp et al. | 343/700 MS |
| 6,707,429 B1 * | 3/2004 | Siegel | 343/700 MS |
| 2002/0024050 A1 | 2/2002 | Odekirk | |

FOREIGN PATENT DOCUMENTS

DE   10017752 A1 * 10/2001

* cited by examiner

*Primary Examiner*—Douglas W Owens
*Assistant Examiner*—Dieu Hien T Duong
(74) *Attorney, Agent, or Firm*—Haynes and Boone, LLP

(57) ABSTRACT

A rectenna capable of power conversion from electromagnetic (EM) waves of high frequencies is provided. In one embodiment, a rectenna element generates currents from two sources—based upon the power of the incident EM wave and from an n-type semiconductor, or another electron source attached to a maximum voltage point of an antenna element. The combined current from both sources increases the power output of the antenna, thereby increasing the detection sensitivity of the antenna of a low power signal. Full wave rectification is achieved using a novel diode connected to a gap in the antenna element of an rectenna element. The diode is conductive at a zero bias voltage, and rectifies the antenna signal generated by the desired EM wave received by antenna. Further, the diode may provide a fixed output voltage regardless of the input signal level. The rectenna element of the present invention may be used as a building block to create large rectenna arrays.

7 Claims, 20 Drawing Sheets

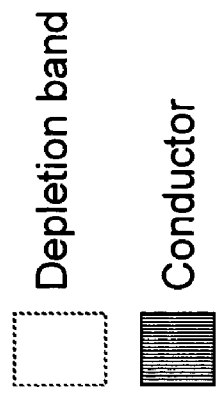
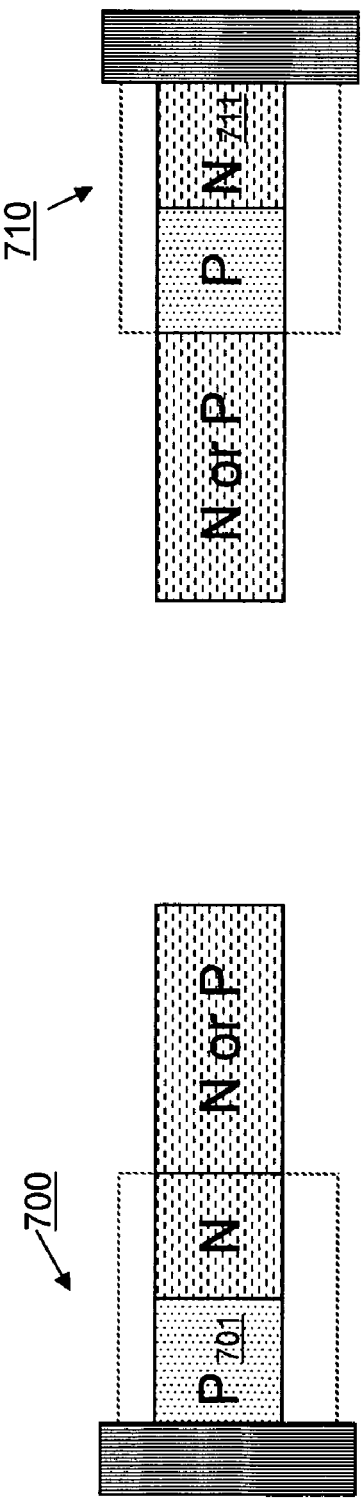
Figure 7(b)
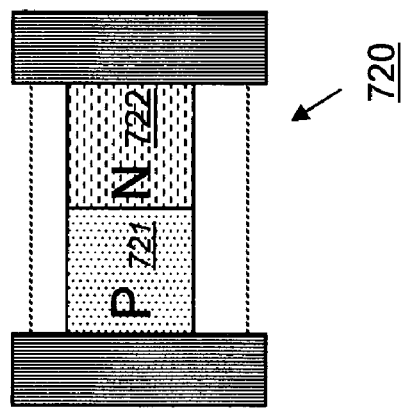
Figure 7(c)
Figure 7(a)

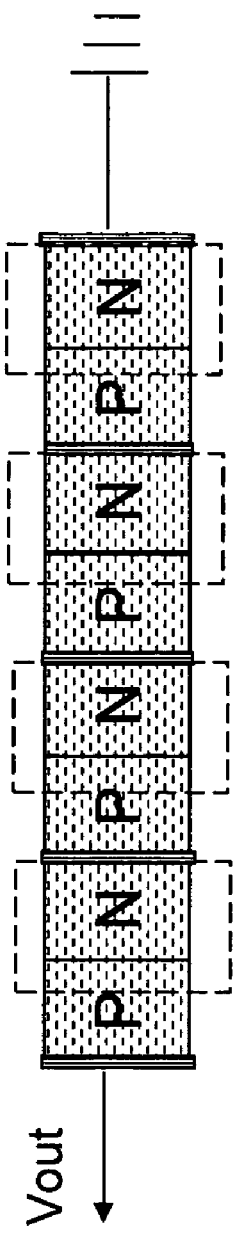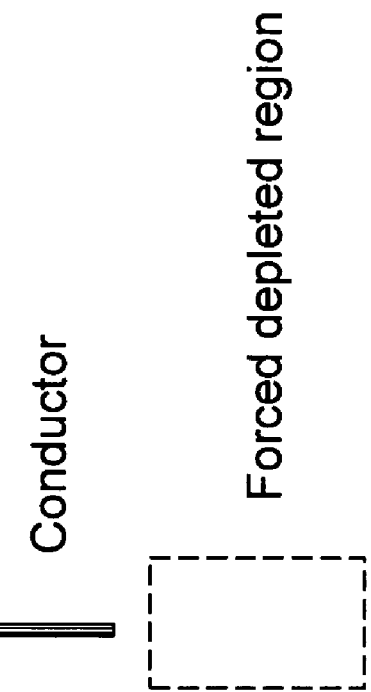
Figure 8(f)

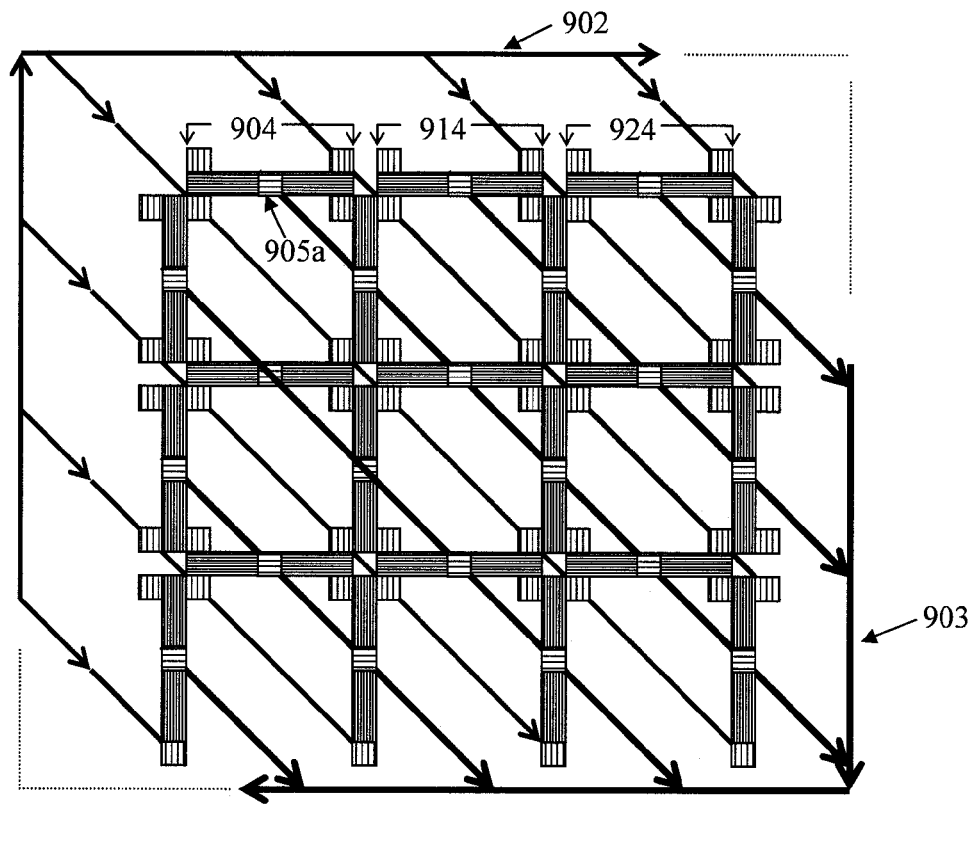
N (electron input) ⟶
N (electron output) that connects the ▤ ⟶
▤ : P section    ▥ : N section    ▨ : Antenna
Side view:
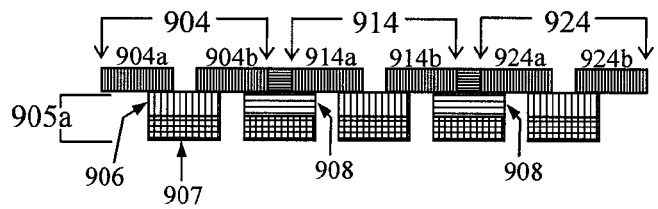
anatenna: ▨
antenna going inside the page: ▤
P type block of XBD: ▤
N type channel to supply input electron to antenna : ▥
N type block of XBD and the input/output channels: ▦
Figure 9

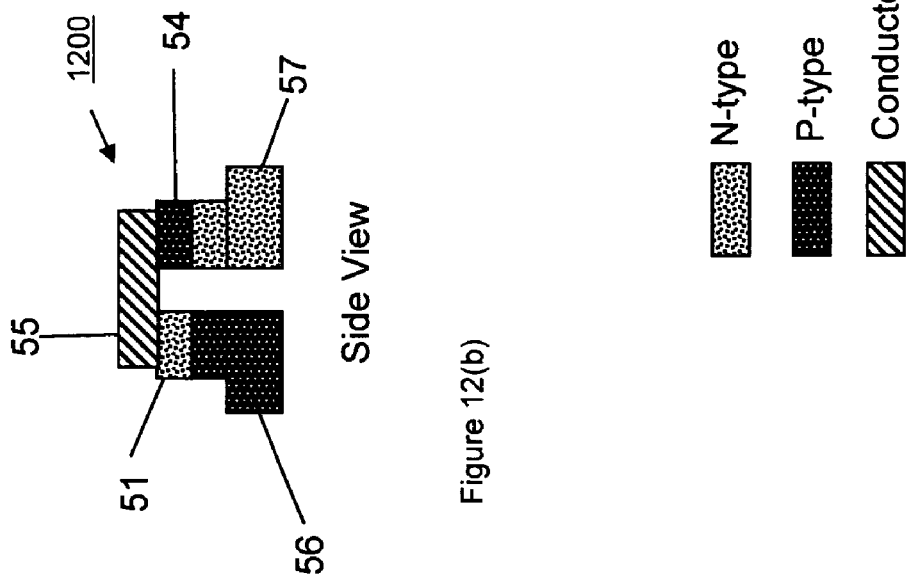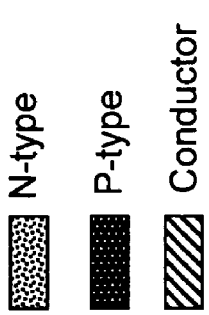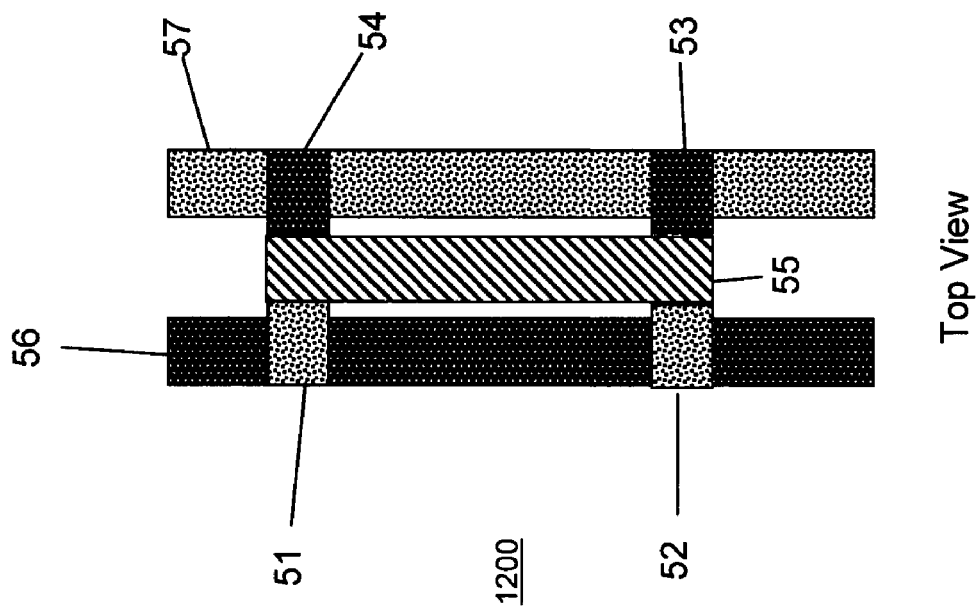
Figure 12(b)
Figure 12(a)

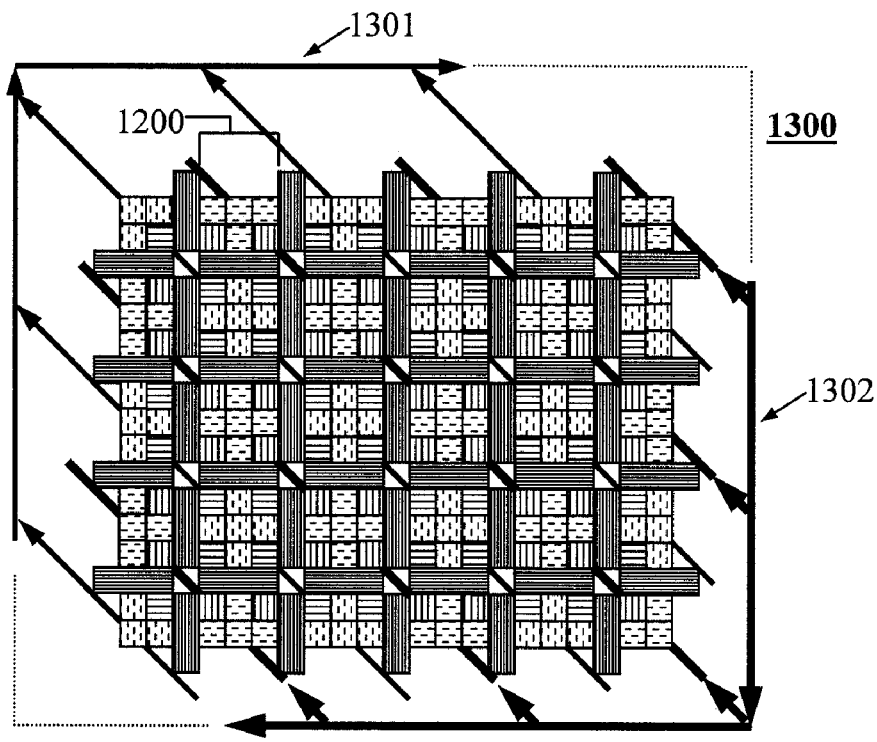
N (electron output) ⟶
P (electron input) ⟵
▤ : P section    ▥ : N section    ▦ : Antenna
▣ : second layer P section    ▦ : second layer N section
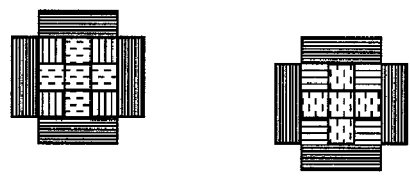
Side view:
Figure 13

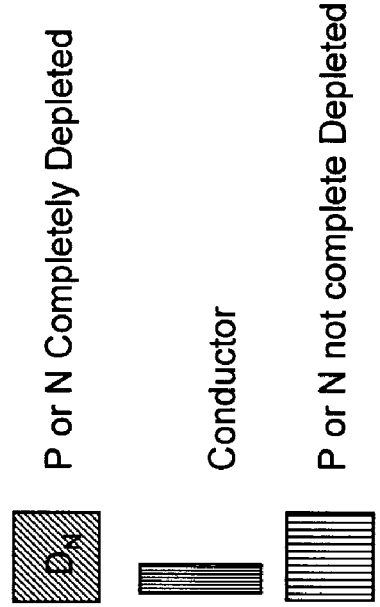
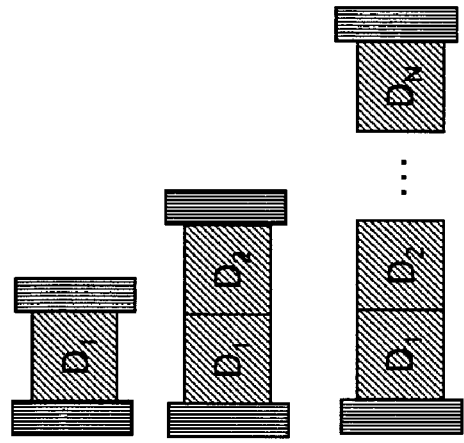
Figure 16(b)
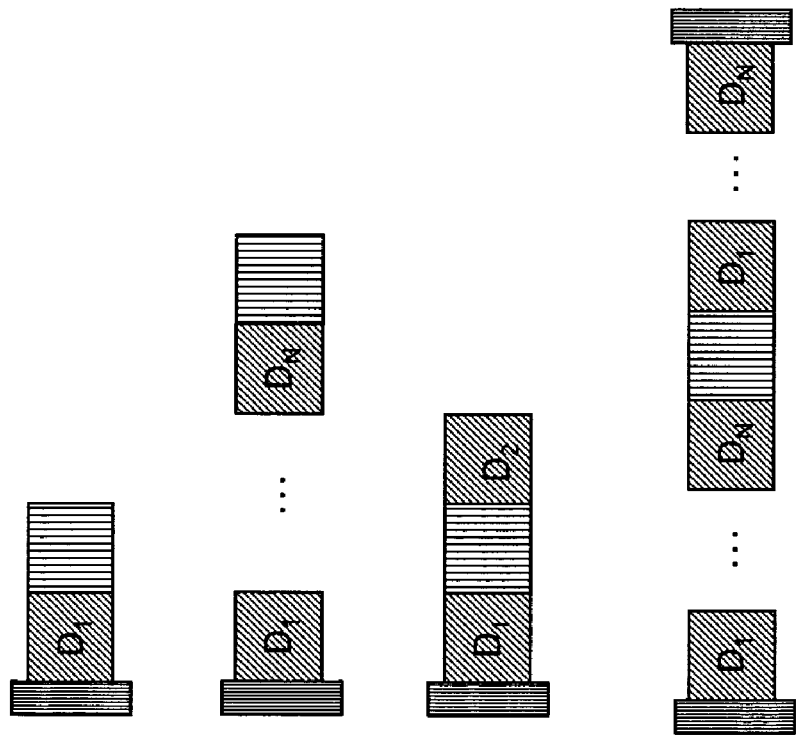
Figure 16(a)

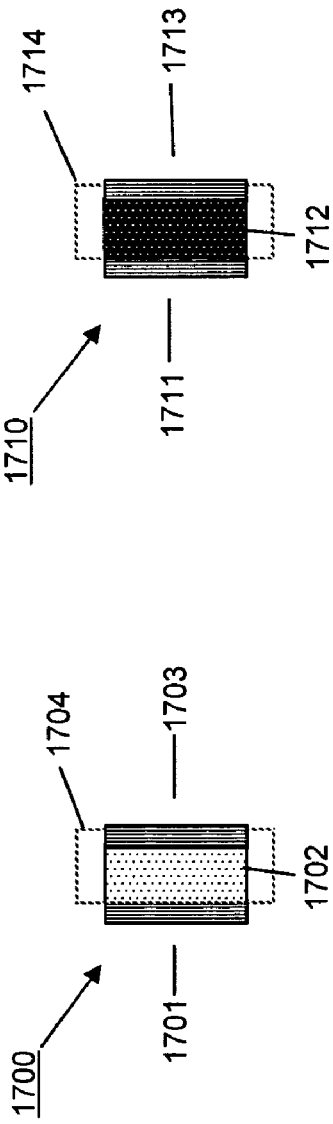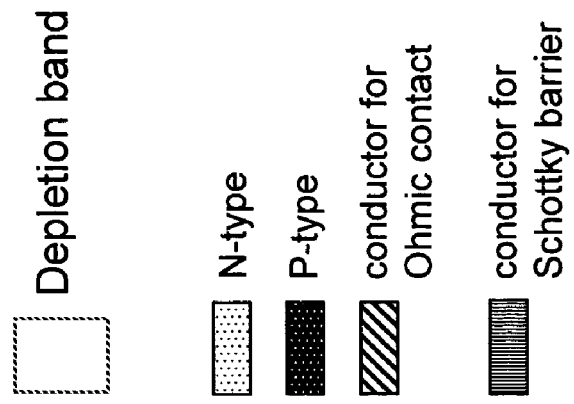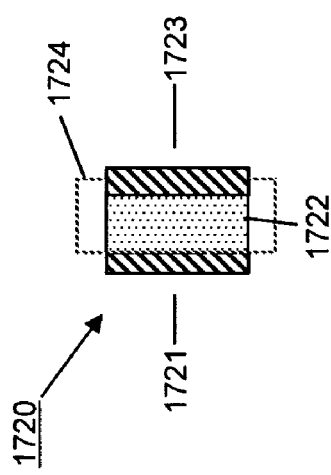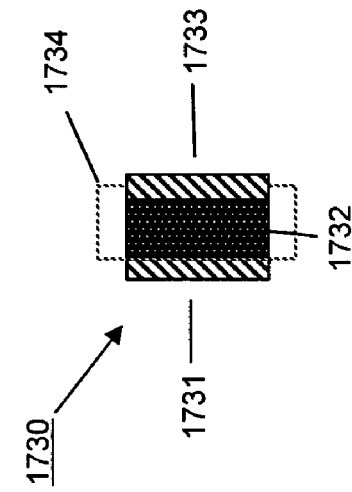
Figure 17(a)
Figure 17(b)
Figure 17(c)
Figure 17(d)

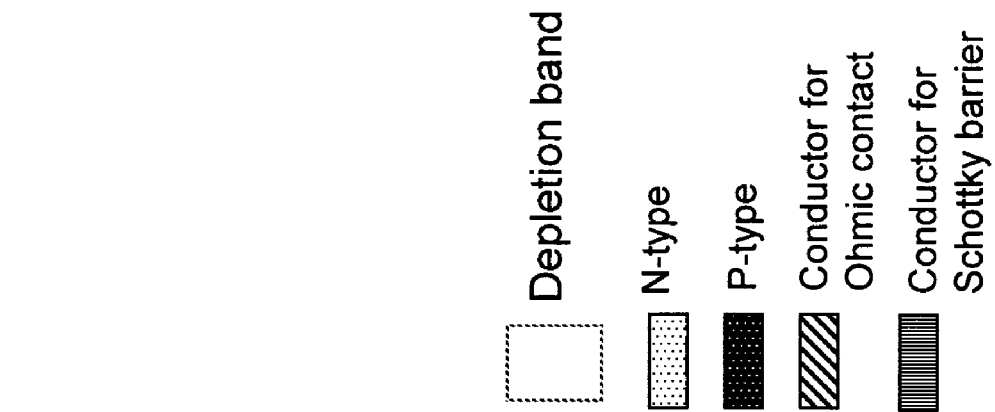
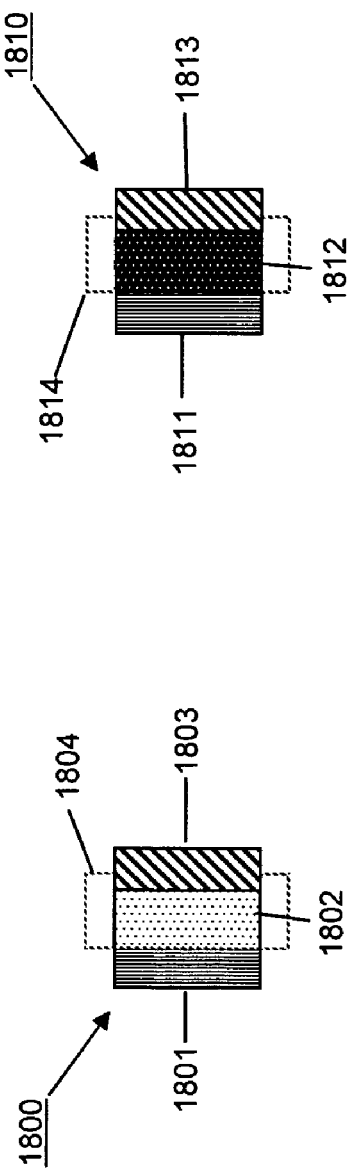
Figure 18(b)
Figure 18(a)

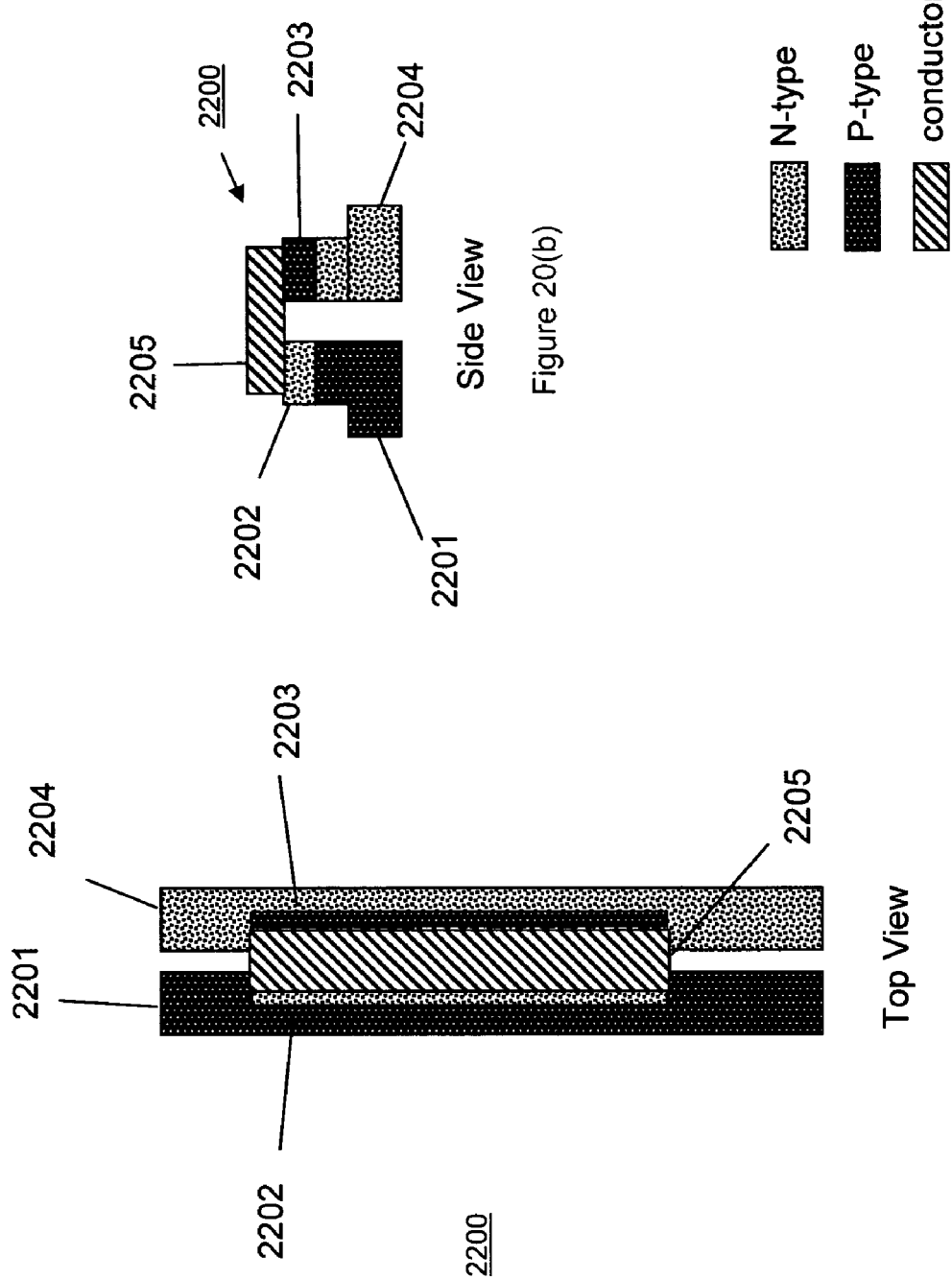

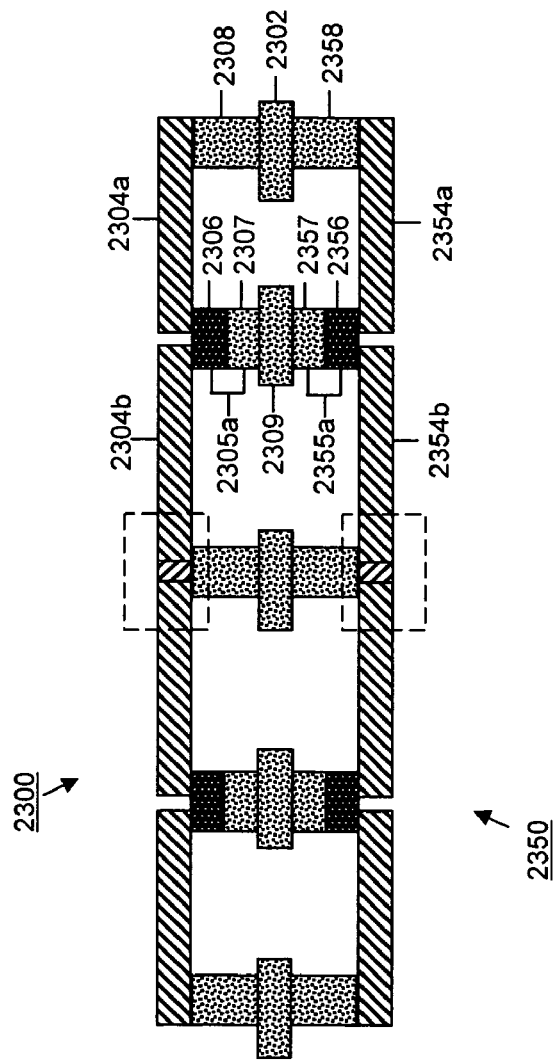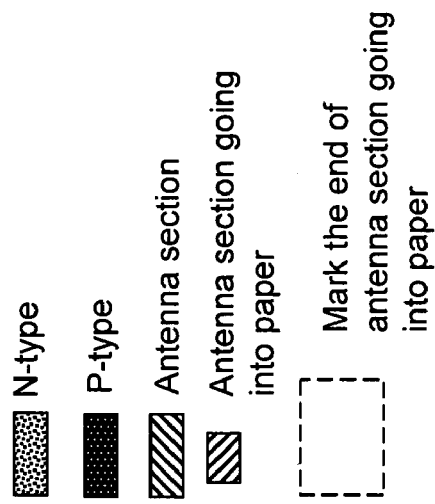
Figure 21

EM RECTIFYING ANTENNA SUITABLE FOR USE IN CONJUNCTION WITH A NATURAL BREAKDOWN DEVICE

BACKGROUND OF THE INVENTION

1. Field of the Invention

The present invention relates to an energy conversion device using rectifying antennae ("rectannae"). In particular, the present invention relates to an energy conversion device which converts electromagnetic wave energy to electrical energy using a semiconductor device that rectifies a small high frequency signal.

2. Discussion of the Related Art

FIG. 1 shows the current versus voltage characteristics of a conventional pn junction diode. FIG. 2 is a schematic representation of conventional abrupt pn junction diode 100. As shown in FIG. 2, conventional pn junction diode 100 includes p-region 101 and n-region 102. P-region 101 may be doped, for example, using a p-type dopant (i.e., electron acceptor, such as boron) and n-region 102 may be doped using an n-type dopant (i.e., an electron donor, such as phosphorus). Near the abrupt junction between p-region 101 and n-region 102, equilibrium due to the difference in electrochemical potentials of the two regions and the diffusion of charge carriers (e.g., electrons and "holes") between the two regions deplete the charge carriers to form "depletion regions" 103 and 104 in p-region 101 and n-region 102, respectively. Under a so-called "abrupt junction approximation", the widths $x_p$ of depletion region 103 and $x_n$ for depletion region 104, with an externally imposed voltage V across the pn junction, are given, respectively by:

$$x_n = \sqrt{\frac{2\varepsilon_s N_A(\phi_i - V)}{qN_D(N_A + N_D)}}$$

$$x_p = \sqrt{\frac{2\varepsilon_s N_D(\phi_i - V)}{qN_A(N_A + N_D)}}$$

where $\varepsilon_s$ is the electrical permittivity of silicon, q is the charge of an electron, $\Phi_i$ is the "built-in" potential of the pn junction, $N_A$ and $N_B$ are the doping concentrations of p-region 101 and n-region 102, respectively.

As shown in FIG. 1, the horizontal axis shows the voltage V across the pn junction, and the vertical axis shows the diode current $I_D$ across the pn junction. As shown in FIG. 1, when voltage V across the pn junction is greater than zero volts and greater than voltage $V_{th}$ (the "threshold voltage"), the pn junction is strongly "forward biased" and the diode current $I_D$ grows exponentially with the voltage V. When the voltage V across the pn junction is less than 0 volts, but not less than the voltage $V_{br}$ (the "breakdown voltage"), the pn junction is "reverse biased" and the diode current $I_D$ is very small. Under reversed bias, as the voltage grows in magnitude, the carriers generated increases in energy, leading to phenomena such as tunneling and impact ionization at voltage $V_{br}$. At voltage $V_{br}$, the diode current $I_D$ becomes very large and the diode has "broken down." At breakdown, the magnitude of the average electrical field (in volts per centimeter) across the pn junction is given by the empirical expression:

$$|E_{br}| = \frac{4.0 \times 10^5}{1 - \frac{1}{3}\log\frac{N_D}{10^{16}}}$$

where $N_D$ is the lesser of $N_A$ and $N_B$.

SUMMARY

The present invention provides a rectifying antenna ("rectenna") capable of converting power from high frequency electromagnetic (EM) waves in free space to electrical energy. According to one embodiment of the present invention, an antenna generates currents from two sources—from a potential difference generated by an incident EM wave in the antenna, and from an n-type semiconductor or another electron source attached to a maximum voltage point of an antenna. The combined current from both sources increases the power output of the antenna, thereby increasing the detection sensitivity of the antenna of a low power signal.

According to one embodiment of the present invention, full wave rectification is achieved using a novel diode connected to an antenna. In that embodiment, the diode is conductive at a zero bias voltage, and rectifies the antenna signal generated by the targeted EM wave in a selected spectrum received by antenna. Further, the diode may provide a fixed output voltage regardless of the input signal level. The diode and the antenna form a rectenna.

The rectenna of the present invention may be used as a building block to create large rectenna arrays. Thus, microwave, sub-millimeter wave, THz wave, IR wave and visible wave applications may be found in a rectenna of this invention. A rectenna of the present invention is scalable, so that future improvements are possible with improvements of semiconductor technology, material science, device physics and antenna design. There is also no upper limit to the frequencies that can be received using such a rectenna. The present invention is applicable to EM-to-DC power generation and supply, humidity, food production, dermatology (e.g., examination of burned skin structure without biopsy) and tomography. The present invention allows T-rays replacement of Roentgen rays (X-rays) in imaging of objects, such as those used to inspect pallets in certain airport safety procedures or in drug detection procedures. The present invention is also applicable to chemical analysis using flames and gases (e.g., toxicity analysis, Fourier spectrum), quality control procedures (e.g., detection of holes in plastic parts, such as those used in automobile applications), and radar applications (e.g., measurement of reflection)

According to another aspect of the present invention, a "natural breakdown device" ("NBD") allows current to flow even with a zero bias voltage. NBD is a natural breakdown device of the diode type, according to one embodiment of natural breakdown invention. An NBD may be used as a rectifier on the rectenna of the present invention to rectify small amplitude high frequency electromagnetic signals.

The present invention is better understood upon consideration of the detailed description below and the accompanying drawings.

BRIEF DESCRIPTION OF THE DRAWINGS

FIGS. 7(a) to 7(c) show different NBDs each without external voltages being applied, represented by NBD 700, NBD 710 and NBD 720, each including a region (e.g., 701, 711, 721 or 722) under a depletion condition.

FIGS. 8(a) to 8(f) show different configurations for NBDs, without external voltages being applied; NBD 800, NBD 810 and NBD 820 each include a region (e.g., 801, 811, 821 and 822) having two or more doping concentrations under a forced depletion condition. In particular, FIG. 8(f) shows multiple NBD 600s connected in series at zero bias.

FIG. 9 shows rectenna array 900 including numerous antennae (e.g., antenna 904, 914 and 924) constructed in accordance with one embodiment of the present invention.

FIGS. 12(a) and 12(b) show, respectively, the top and side views of gapless dipole antenna 1200, in accordance with one embodiment of the present invention.

FIG. 13 shows rectenna array 1300 including numerous gapless antennae.

FIG. 16(a) to 16(b) shows, schematic representations of various configurations of NBDs with no external voltages being applied, according to one embodiment of the present invention.

FIGS. 17(a) to 17(d) show schematic representations of various NBDs with no external voltages being applied, according to one embodiment of the present invention.

FIG. 18(a) is a schematic representation of NBD 1800 at zero bias, according to one embodiment of the present invention; NBD 1800 represents a natural breakdown Schottky diode under a forced depletion condition.

FIG. 18(b) is a schematic representation of NBD 1810 at zero bias, according to one embodiment of the present invention; NBD 1810 represents a natural breakdown Schottky diode under a forced depletion condition.

FIGS. 20(a) and 20(b) show, respectively, the top and side views of gapless dipole rectenna element 2200, in accordance with one embodiment of the present invention.

FIG. 21 shows, gap rectenna arrays 2300 and 2350 connected in parallel, according to one embodiment of present invention.

DETAILED DESCRIPTION OF THE PREFERRED EMBODIMENTS

It should be noted that while the following description discloses mainly dipole rectenna elements in a square array (i.e., a two-dimensional antenna array having the same number of antenna elements along each dimension), the present invention is applicable to rectennae of other formats, such as a two-dimensional configuration having different number of antenna elements along the two dimensions. The present invention provides an array of dipole rectennae elements configured to capture and harvest electromagnetic energy for power generation.

Figure 10B:
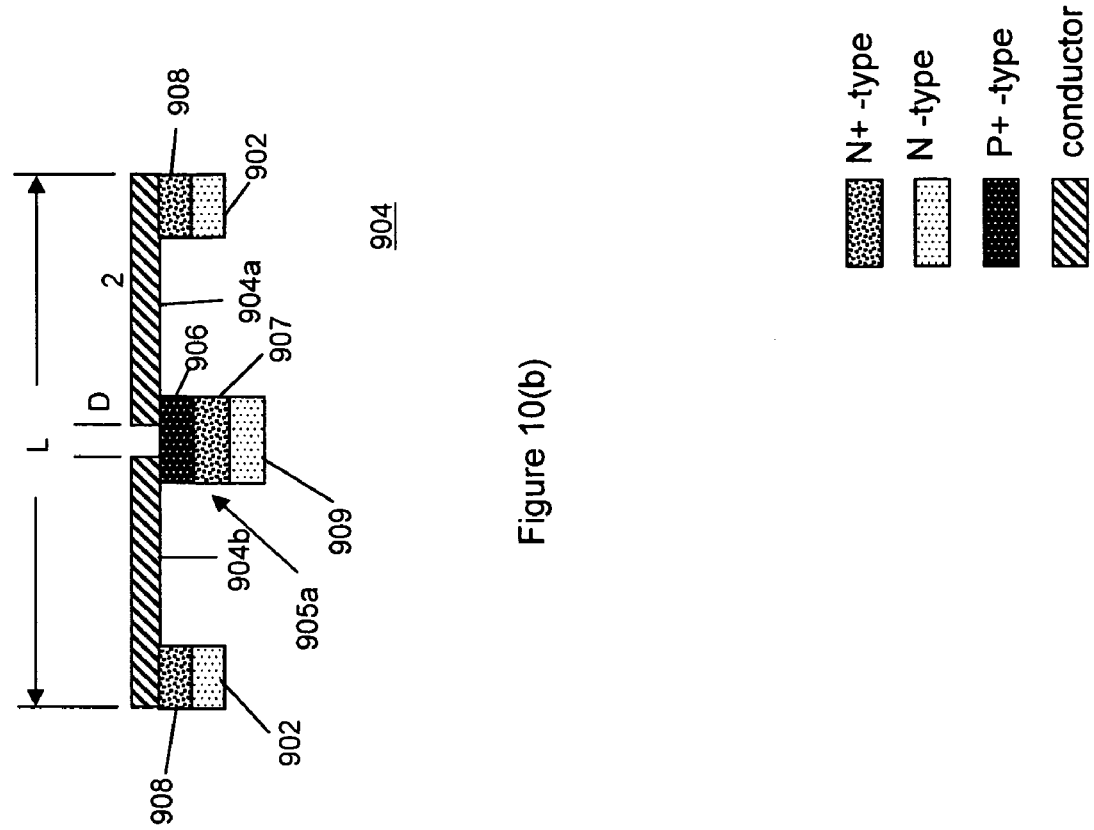
FIGS. 10(a) and 10(b) show top and side views of one embodiment of the invention, illustrating dipole antenna 904 in rectenna array 900 of FIG. 9.
Figure 10A:
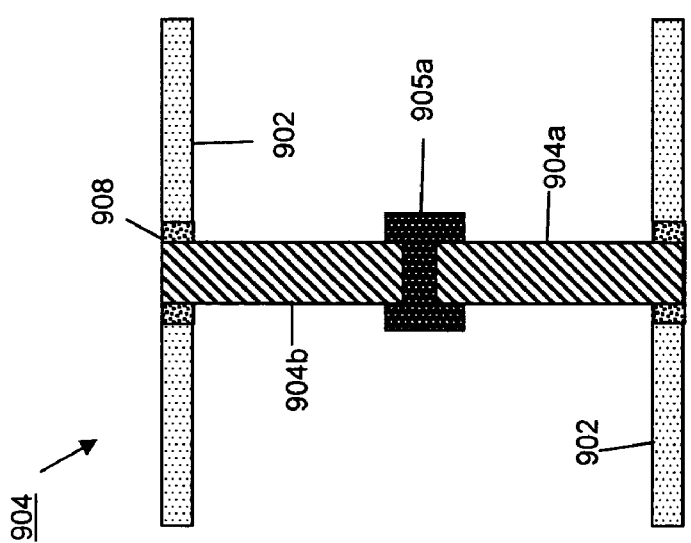

One embodiment of the present invention is shown in FIG. 9. FIG. 9 shows rectenna array 900 including numerous antennae (e.g., antennae 904, 914 and 924). FIGS. 10(a) and 10(b) are top and side views of rectenna array 900 of FIG. 9, showing dipole antenna 904, which includes antenna sections 904a and 904b contacting rectifier structure 905a. Rectifier structure 905a rectifies the signal received at antenna 904a and 904b. Rectifier structure 905a may be provided, according to this embodiment of the present invention, by a "natural breakdown device" (NBD), which is further discussed below in this detailed description and referred to as NBD 300. NBD 300 is a "Natural Breakdown Device" (NBD), natural breakdown diode, according to one embodiment of the present invention. As shown in FIGS. 10(a) and 10(b), rectifier structure 905a includes p-region 906 and n-region 907. The forced depleted p-region of rectifier structure 905a connects directly to antenna. The forced depleted p-region of rectifier structure 905a connects directly to antenna.

Some rectifier qualities of rectifier structure, such as 905a, which allow dipole antenna 904 and other antennae presented in the present invention operate efficiently include: (1) being conductive at near zero bias voltage. (2) having a reverse bias current that is significantly greater than a reverse bias leakage current of a conventional pn-junction diode, and (3) operates as if it is in a reverse bias breakdown even though rectifier structure 905a is forward biased within a predetermined voltage range. When the input voltage is within this predetermined voltage range, the output voltage remains constant. This input voltage range can be configured to correspond to the range of signal strength that the antenna is expects to receive.

As shown in FIG. 10(b), each dipole antenna 904 has a length L and is made up from two antenna sections (e.g., sections 904a and 904b) separated in the center of the antenna by a gap of length D. Length L is ideally one-half the wavelength of the electromagnetic (EM) wave that antenna is designed to receive, D is typically significantly smaller than the smallest wavelength of the electromagnetic (EM) wave the antenna is expected to receive. P-region 906 of NBD 300 is connected, on one side, next to the gap of antenna 904, to both sections 904a and 904b and, on the other side, to n-region 907. Heavily doped n+-regions 908 connect to both ends of antenna 904. A rectenna element is thus formed by antenna 904, rectifier structure 905a, and n+-regions 908. N+-regions 908 of multiple rectenna elements are connected to constitute input channel 902 for electrons. Similarly, heavily doped n+-regions 909 connect the n-regions of multiple diode structures (e.g., n-region 907 of diode structure 905a) in parallel to form output channel 903 for electrons. Antenna sections of each antenna are isolated from the antenna sections of other antennae, so that each antenna may attain whatever voltage level due to the EM wave incident to that antenna. N+regions 908 and electron input channel 902 have the same conductivity type. In another embodiment, n+-regions 908 may be replaced by heavily doped p+-regions.

When an EM wave of wavelength 2L is received by the dipole antenna, a voltage difference is created between the ends of the antenna sections. Relative to the anode portion of the diode structure at the center of the dipole antenna, the voltages at the opposite ends of the dipole antennae are at opposite polarities. The resistances between n+-regions 908 to antenna 904 and between antenna 904 and the NBD are very small. The voltage difference causes electrons to flow in both antenna sections from n+-regions 908 of FIG. 10 to rectifier structure 905a. This is the first source of electron current in rectifier structure 905a. The second source of electron current in rectifier 905a is the electron current induced in the antenna by the magnetic field of the EM wave. This electron current has a magnitude that depends on the power of the incident EM wave. The direction of each source of electron currents at any given time is determined by the phase of the EM wave. In this configuration, the two sources provide electron currents to the dipole antenna. Maximum currents in both antenna sections occur at the center of the dipole antenna. The gap length D of antenna 904 is designed to be much smaller than ¼ the wavelength of the EM wave that antenna 904 is designed to receive. Ideally, each of antenna sections 904a and 904b is less than ¼ the wavelength of the EM wave being received. The magnitude of the current from n+-regions 908 is determined by the magnitude of the voltage difference and the magnitude of resistance between the junction of the n+-region and the contacting antenna section of the dipole antenna.

Figure 3:
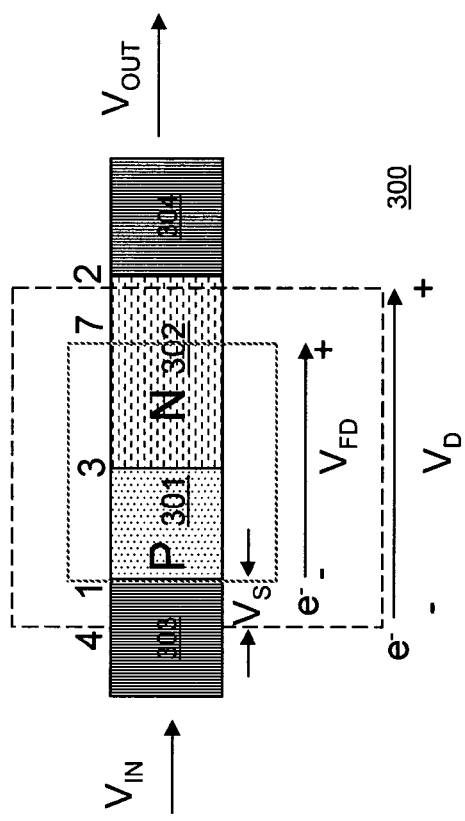
FIG. 3 is a schematic representation of a natural breakdown device—NBD 300, according to one embodiment of the present invention.

In this configuration, where the rectifier at the center of the dipole antenna is an NBD similar to that discussed for NBD 300 of FIG. 3, the electron currents in the dipole antenna are shunted by the NBD 300 to the output channel (e.g., output channel 903). As explained below, the NBD maintains a constant voltage at the output channel, thus the electron currents of multiple antennae are summed at electron output channel 903. For example, on a dipole antenna as shown in rectenna array 900 of FIG. 9, an electron current from electron input channel 902 flows to the n-regions (e.g., n+ regions 908 of FIG. 10) surrounding the antenna sections, through the antenna sections to the NBD 300s, and from there the electron current flows to electron output channel 903. Thus, rectenna array 900 may be seen as a battery providing a voltage (i.e., the voltage across the NBD) between electron input channel 902 and electron output channel 903. DC power is collected along the N-type channels diagonally and each center NBD of gap rectenna. Extra electrons are supplied by the connections of n-type channels diagonally at the ends of the antenna.

Figure 6:
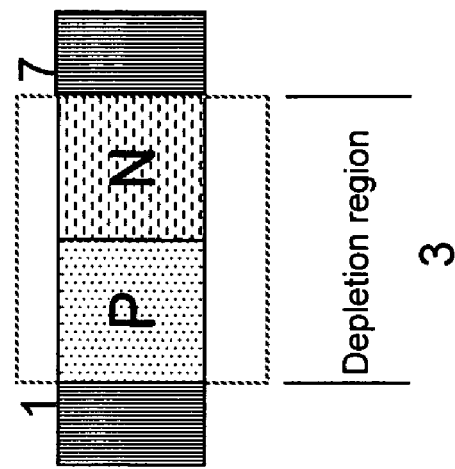
FIG. 6(a) is a schematic representation of a natural breakdown device—NBD 600, according to one embodiment of the present invention.
FIG. 6(b) shows a NBD under a zero bias voltage, according to one embodiment of the present invention.
Figure 6:
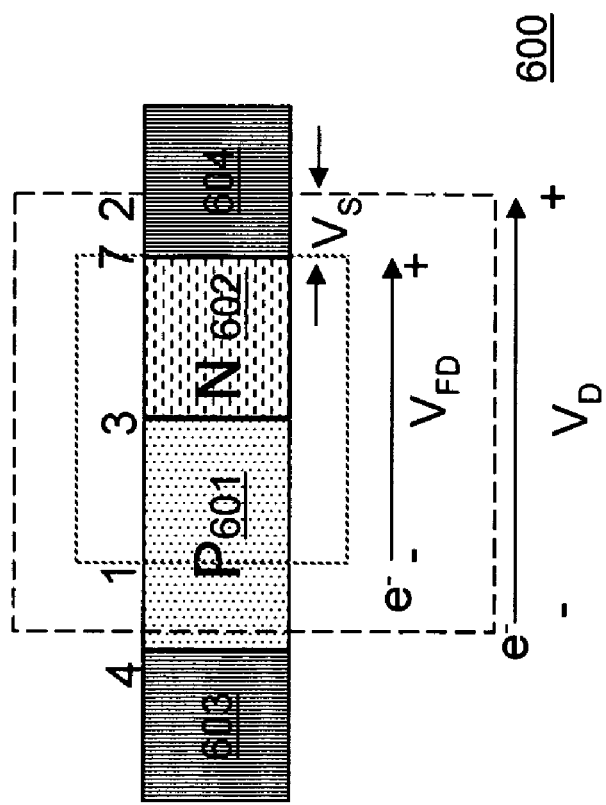
Figures 8A, 8B, 8C, 8D, 8E:
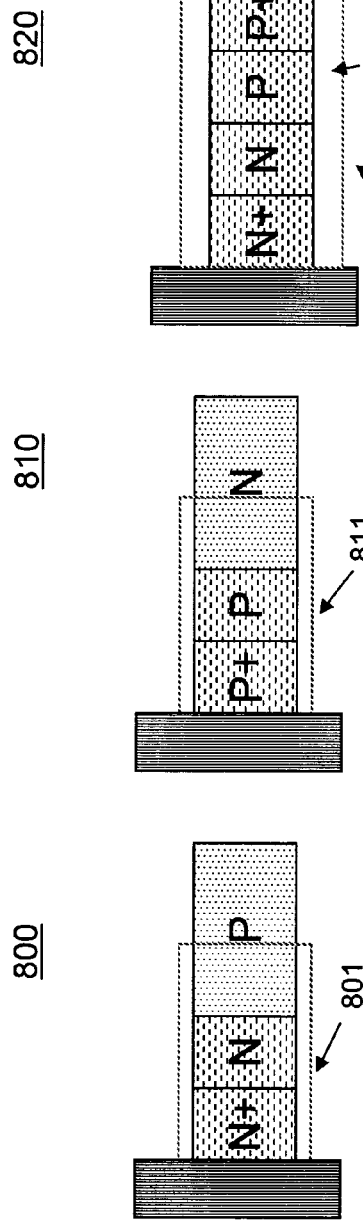

[1] In this description, when a device requires a diode similar to NBD 300 discussed in FIG. 3, the required diode is referred as "NBD 300". Similarly, when a device requires a diode similar to NBD 600 of FIG. 6, the required diode is referred as "NBD 600".

Figure 11:
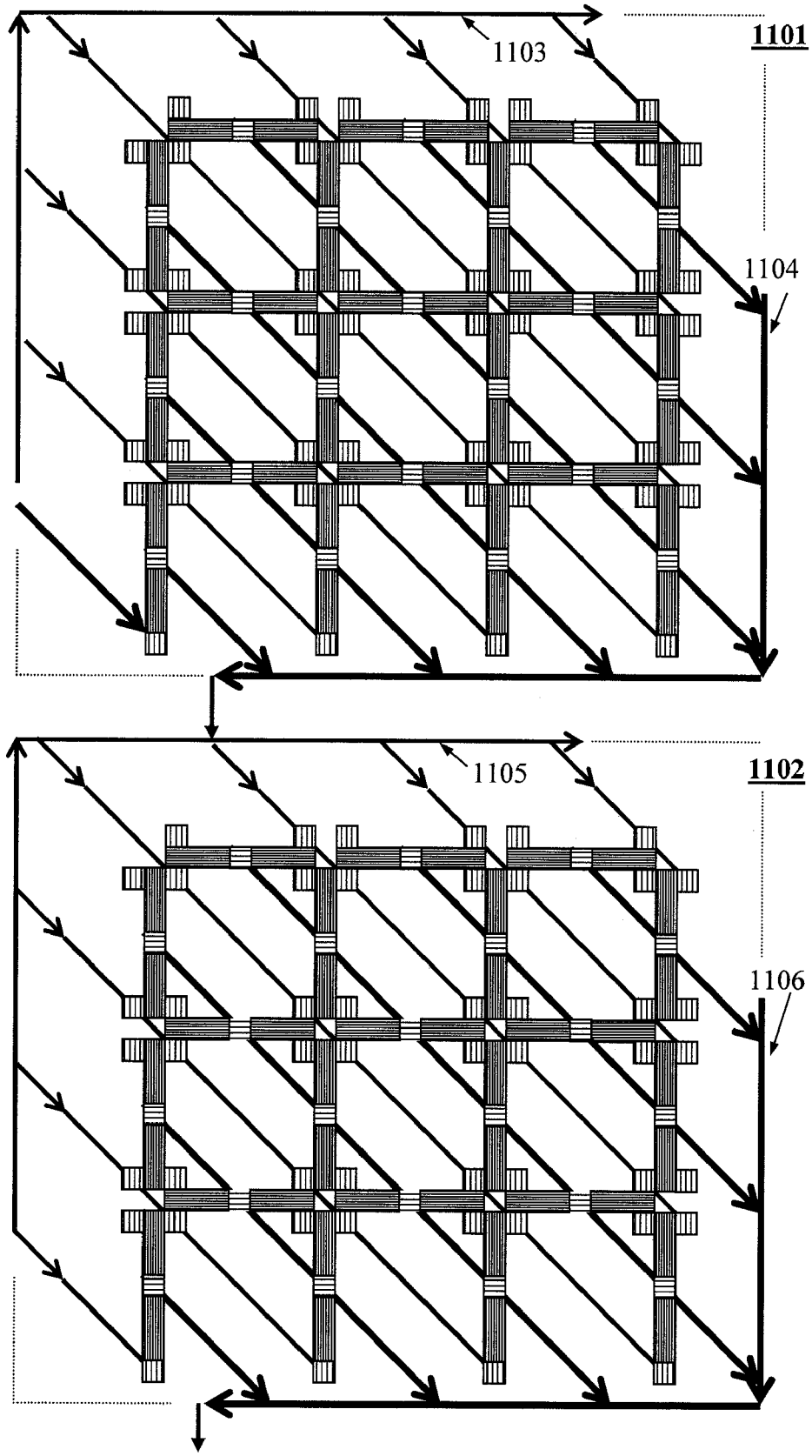
FIG. 11 shows gap rectenna arrays 1101 and 1102 connected in series for DC power collection, showing electron output channel 1104 of rectenna array 1101 being connected to electron input channel 1105 of rectenna array 1102.

FIG. 11 shows rectenna arrays 1101 and 1102 connected in series by connecting electron output channel 1104 of rectenna array 1101 to electron input channel 1105 of rectenna array 1102. Thus connected, rectenna arrays 1101 and 1102 may be seen as a battery having a voltage that is twice the NBD voltage between electron input channel 1103 and electron output channel 1106. In this manner, multiple rectenna arrays may be connected to provide a device having a voltage that is N times the NBD voltage, where N may be any positive integer greater than or equal to 1. Alternatively, rectenna arrays 1101 and 1102 may be connected together in parallel if they have the same output voltage, with electron input channels 1103 and 1105 connected together and electron output channels 1104 and 1106 connected together, to create a device having twice the current of an individual rectenna array.

As explained below, an NBD may be used to detect and rectify very high frequency signals. Accordingly, by detecting and rectifying very high frequency EM waves efficiently, the present invention provides a device for detecting and converting into DC power using frequencies of the EM spectrum that are hitherto impractical or impossible to use for a power conversion application, such as frequencies higher than the visible spectrum. The present invention finds applications in power conversion applications using a wide range of EM wave frequencies, such as infra-red (IR) and visible light (e.g., solar energy). The present invention may be utilized as a fast response photo-sensor in optical sensing and optical networks. The antenna in each rectenna element (or rectenna) can be any size and any shape of any type. A rectenna array can be configured out of many different rectenna elements. Also, each rectenna array can be different from the rectanna arrays of FIGS. 9 and 11. The rectenna array of the present invention collects the electrons current flowing from all the input channels of the rectenna elements to all the output channels of the rectenna elements. The completely depleted region of an NBD is directly connected to the antenna.

The presence of a gap in each dipole antenna limits the highest frequency under which a rectenna (or a rectenna array) of the present invention may operate. Thus, a gapless dipole antenna is developed, which is shown in top and side views in FIGS. 12(a) and 12(b), respectively. NBD 600 may be used as an input NBD for gapless dipole antenna, which is further discussed below in this detailed description. As shown in FIGS. 12(a) and 12(b), antenna 55 of dipole antenna 1200 is connected to two NBDs (formed by p-regions 53 and 54 and n-region 57), forming an electron output terminal on one side, and to two NBDs (formed by p-region 56 and n-regions 51 and 52), forming an electron input terminal on the other side. In other words, a rectenna element is formed by antenna 1200, two NBDs for input at an electron output terminal and two NBDs for output at an electron input terminal. A voltage difference between the electron input terminal and the electron output terminal of a dipole rectenna element is provided by the sum of the voltages across the two NBDs. Thus, dipole antenna 1200 has a resolution of two NBDs, which is twice the resolution of dipole antenna 904 of FIGS. 9 and 10. When an EM wave is received by an antenna, a voltage difference is created between the ends of this antenna. The voltages at the opposite ends of the dipole antenna are of opposite polarities. The end of the antenna having the positive voltage will have electron flow induced from the input NBDs to the output NBDs because the resistance between NBD 300s and the antenna 55 is very small. Input NBDs are provided for electron input. Output NBDs provide a rectifier structure. The input NBD directs the electrons from the electron input channels to the antenna. The output NBD serves as a rectifier structure for antenna signals. Output NBD has a forced depleted p-region connects directly to antenna. NBD 300 may be used as an output NBD because the p-region connects to antenna is a force depleted region. The n-region of an input NBD can be either non-forced depleted or forced depleted region connects directly to antenna. The forced depleted input NBDs will deliver better rectenna efficiency than the non-forced depleted input NBDs. N-region of NBD 600 is forced depleted and may be used as an input NBD for gapless rectenna design. The completely depleted regions of NBD 300 or NBD 600 are directly connected to antennae.

The phase of the EM wave determines which end of the antenna has an electron current. In this configuration, there is only one current source for the antenna (rectenna or rectenna element). The source of electron current is the p+-regions at the end of the antenna next to the diode structures (e.g., p+-region 56 of FIGS. 12(*a*) and 12(*b*)). The magnitude of the current from the p+-regions is determined by the magnitude of the voltage difference and the magnitude of resistance between the junction of the p+-region and the contacting antenna section of the gapless antenna. The voltage induced by an EM wave at both ends of antenna element 55 is equal to the NBD voltage, relative to either the input terminal or the output terminal or dipole rectenna element 1200. The NBD can maintain a larger fixed output voltage for signals within a small input voltage range. If the voltage induced by EM wave on antenna 55 is within this input voltage range, then the voltage difference between antenna 55 and output n-channel 57 remains fixed. Therefore there is no noise or ripple created by the EM waves as other rectenna. DC power is collected by connecting the n-type channels under the output NBDs (p-regions 53 and 54 in FIG. 12(*a*)). Extra electrons are supplied by the connections of P-type channels under the input NBDs. When two gapless antennae are lined up end to end with a separation distance D then this antenna pair will operate like a single gap antenna as described above. This is because the input NBDs at the far ends of the gapless antenna pair act like the gap antenna n+-type input channel and the two output NBDs in the center of the gapless antenna pair act as the center output NBD of the gap antenna.

Figure 14:
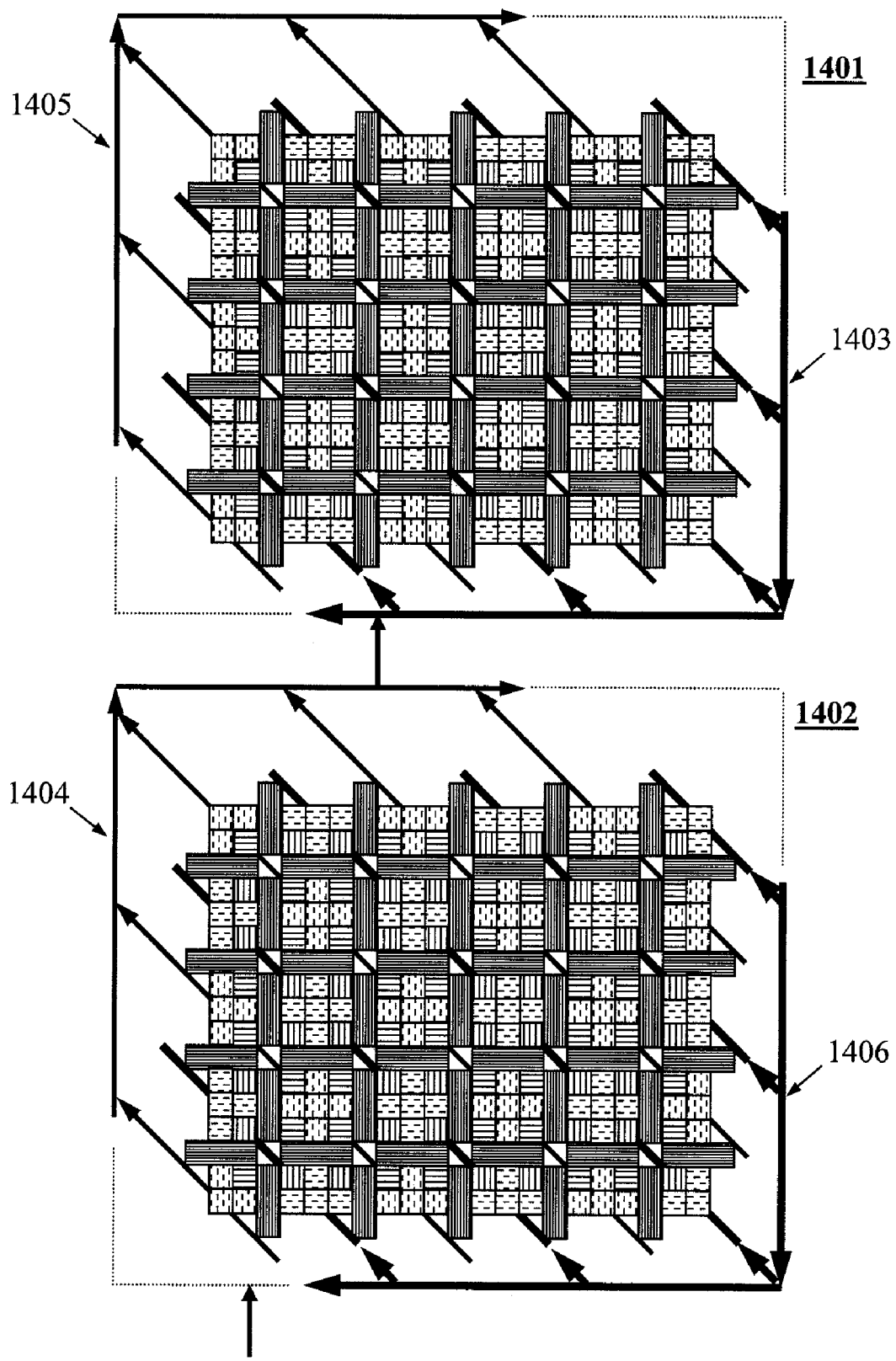
FIG. 14 shows rectenna arrays 1401 and 1402 connected in series for DC power collection, showing electron output channel 1404 of rectenna array 1402 being connected to electron input channel 1403 of rectenna array 1401.
Figures 15A, 15B, 15C, 15D:
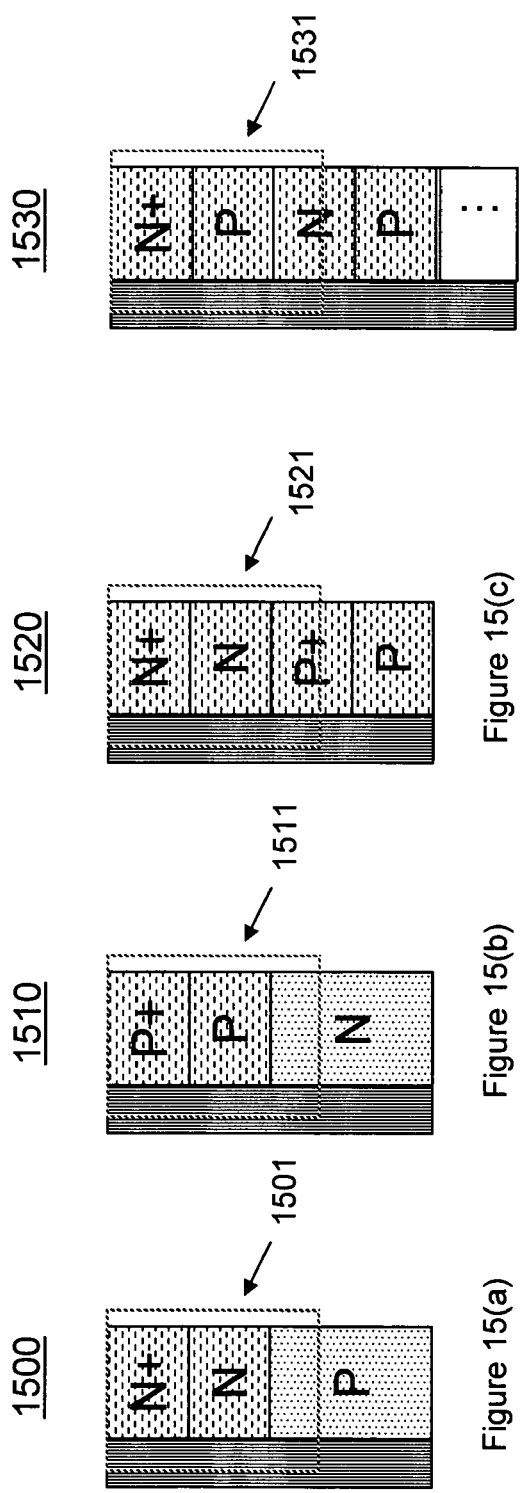
FIG. 15(a) to 15(d) shows schematic representations of various NBDs with no external voltages being applied, according to one embodiment of the present invention.

FIG. 13 shows rectenna array 1300 including numerous gapless dipole antennae (e.g., antenna 1200 of FIG. 12) with their respective electron input terminals connected together to form electron input channel 1302 and their respective electron output terminals connected to form output channel 1301. Numerous such rectenna arrays may be connected in series or in parallel, as shown in FIG. 14. As shown in FIG. 14, electron output channel 1404 of rectenna array 1402 is connected serially with electron input channel 1403 of rectenna array 1401 through a metal trace (not shown) to provide current at twice the output voltage of the individual rectenna array. The metal trace prevents the electron input channel (p-type) and electron output channel (n-type) from forming a pn-junction, as a pn junction causes an undesirable voltage drop. Rectenna array 1401 and rectenna array 1402 can be connected in parallel by having electron input channels 1403 and 1406 connected together and electron output channels 1405 and 1404 connected together. Connecting two of the same rectenna arrays in parallel provides twice the current of an individual rectenna array.

Gapless rectenna element 1200 collects current between the electron input channels and the output NBDs. Another gapless antenna 2200 utilizes two sources of current, similar to gap antenna 904, according to another embodiment of the present invention. Dipole antenna 2200 is shown in top and side views in FIGS. 20(*a*) and 20(*b*), respectively. As shown in FIGS. 20(*a*) and 20(*b*), antenna 2205 of dipole antenna 2200 is connected to an NBD formed by p-regions 2203 and n-region 2204, forming an electron output terminal on one side, and to an NBD formed by p-region 2201 and n-regions 2202, forming an electron input terminal on the other side. A rectenna element includes antenna 2205, an electron input terminal and an electron output terminal. DC power is collected by connecting n-type channels under the output NBD (e.g., n-regions 2204 in FIG. 20(*a*)). Extra electrons are supplied by connecting p-type channels under the input NBD. The input terminals of rectenna elements are connected together and the output terminals of rectenna elements are connected together to form the rectenna array.

FIG. 21 shows gap rectenna arrays 2300 and 2350 connected in parallel such that input channels and output channels are shared by both rectenna arrays. The sharing of input and output channels is shown in FIG. 21 by input channel 2302 and output channel 2309. Rectifiers 2305*a* and 2355*a* output electrons to output 2309 and n-regions 2308 and 2358 receive electrons from input channel 2302. Using this type of packaging provides a higher density design providing a way to increase the received EM wave bandwidth and power output. The reader can see that the non-gap rectenna arrays can be arranged in parallel similarly as just described for the gap rectenna.

Rectifier structures of the EM rectenna of the present invention may include different numbers and types of NBDs, according to one embodiment of the present invention. These NBDs of a rectifier can be connected in series, in parallel or both. Therefore, the rectifier structures of the EM rectenna can be in different configurations depending on the requirements of the desired result or performance. When input voltage is varied within the Vs range, the output voltage of a NBD remains constant. This means that the output voltage of an antenna can be multiplied when rectifier has NBDs connects in series, the output current of an antenna can be regulated when rectifier has NBDs connects in parallel. By varying the output voltage or current, a variation of the EM rectennae for different needs is possible. This may improve for the efficiency of the rectenna.

Since each antenna gathers electromagnetic waves at a frequency consistent with its size and shape, and the diode (i.e., the rectifier structure) rectifies that energy into a D.C. current. As in both gap and gapless rectenna embodiments of the present invention, each rectenna element can be any size and any shape, and can be provided by any antenna type. A rectenna array can be made out of many different rectenna elements. The present invention is not limited to a dipole rectenna design, nor to the full wave rectifying rectenna described above. According to another aspect of the present invention, an NBD capable of rectifying a small amplitude, high frequency signal is provided, which is suitable for use in conjunction with the energy conversion device described above. This NBD is a "forced depletion" natural breakdown device, as explained below, according to one embodiment of the present invention.

Present invention referred a p-type or n-type region is completely depleted when the whole region is depleted. This region may include different materials in any forms, shapes, dimensions, conductivity and concentrations. The doping level and other parameters may be mixed to achieve the desired results. The examples and drawing shown for NBDs are homogeneous doping with same structure for explanation purpose only.

According to one embodiment of the present invention, a NBD type diode includes a semiconductor (say, p-type region) that has a width $w_p$ that is less than or equal to the depletion width $x_p$ of a conventional abrupt pn-junction without an externally imposed voltage. That is:

$$w_p \leq x_p = \sqrt{\frac{2\varepsilon_s N_D \phi_i}{qN_A(N_A + N_D)}}$$

where $\varepsilon_s$ is the electrical permittivity of silicon, q is the charge of an electron, $\Phi_i$ is the "built-in" potential of the pn junction, $N_A$ and $N_B$ are the doping concentrations of p-region 101 and n-region 102, respectively.

FIG. 3 is a schematic representation of NBD 300, according to one embodiment of the present invention. As shown in FIG. 3, NBD 300 includes p-region 301 and n-region 302, with p-region 301 having a width $w_p$, which is less than or equal to the depletion width $x_p$ of a corresponding depletion width in the p-region side of a conventional pn junction. (A semiconductor region having a depletion width that is less than the depletion width for the corresponding semiconductor type in a conventional pn junction is referred herein as having a "forced depletion" width). In contrast, the width of n-region 302 may be smaller than, greater than or equal to the conventional depletion region $x_n$ for the n-region of a conventional pn junction diode of comparable doping concentrations. One embodiment of the present invention is a forced depletion condition on p-region 301, and n-region 302 having a width greater than $x_n$. Also shown are contact regions 303 and 304 which are contacts to allow NBD 300 to be connected to an electronic circuit. The doping concentrations in p-region 301 and n-region 302 are sufficiently high such that contacts 303 and 304 are ohmic contacts. Contact region 303 and 304 may be formed, for example, by depositing a conventional interconnect conductor, such as aluminum or copper, using conventional chemical vapor deposition techniques, or other means known to those skilled in the art. P-region 301 and n-region 302 may be formed in a conventional silicon substrate using ion implantation, or other means known to those skilled in the art.

Width $w_p$ of an NBD 300 may be calculated based upon the doping concentration. The predetermined width $w_p$ for NBD 300 may be calculated using the following steps:

(1) First choose doping concentrations for a p-region and an n-region of a conventional PN junction diode such that, under the zero biasing voltage, the p-region has a depletion width $X_p$ between point 4 and point 3 and the n-region has a depletion width $X_n$ between point 3 and point 2, as shown in FIG. 3. This will create a built-in voltage $-V_D$ volts in the conventional pn junction diode. Here the depletion width voltage $V_{FD}$ is equals to $-V_D$.

(2) Select a voltage $V_S$ as the maximum forward bias voltage that can be applied on NBD 300 to still maintain the breakdown current normally observed with a reverse-bias breakdown. The value of $V_S$ is between zero and the conventional pn junction diode built-in voltage $V_D$. $V_X = V_D - V_S$. According to one embodiment of the present invention, the value of Vs can be tuned or selectable to accommodate an active voltage range for NBD operation. The depletion width of NBD 300 remains unchanged as long as the input voltage is between zero and $V_s$. When the input forward bias voltage applied on NBD 300 is between 0 and $V_s$, the output voltage is a fixed constant voltage. This fixed output characteristic in response to an input voltage less than $V_S$ allows a forced depletion NBD to rectify a small amplitude, high frequency signal. When an input voltage on an NBD is smaller than $V_s$, an NBD which has a smaller $V_s$ conducts a larger current than an NBD which has a larger $V_s$. Operating within the range between 0 volts and $V_s$, an NBD regulates voltage.

(3) Calculate the depletion width $w_p$ of p-region 301 such that, when voltage $V_S$ is imposed on 303 toward p-region 301, the whole p-region 301 remains depleted. The built-in voltage $V_{FD}$ of the NBD 300 equals to $-(V_D - V_S)$ volts. If $w_p = x_p$, $V_S$ is zero volts.

Note that the width $w_p$ is calculated above using an abrupt junction approximation. Other suitable methods may also be used. As explained above, the condition $w_p < x_p$ is referred to as a "forced depletion condition" and, under such a condition, p-region 301 is referred to as a "forced depletion region", according to one embodiment of the present invention. The condition $w_p = x_p$, is referred to as a "non-forced depletion condition" and, under such a condition, p-region 301 will be referred to as a "non-forced depletion region", according to another embodiment of the present invention. Once $w_p$ is determined, NBD 300 with the p-region 301 is completely depleted between contact region 303 and n-region 302 may be created with different width of n-region 302. $W_n$ is the depletion band width of n-region 302 on NBD 300. The width of n-region 302 may range from $w_n$ to larger than $x_n$. The difference in the width of n-region 302 will create variations for the NBD 300. NBDs can be created having a width for n-region 302 greater than $x_n$. When the external voltages applied to contacts 303 and 304 is zero (zero biasing or without bias), p-region 301 of NBD 300 is completely depleted.

In another embodiment of the present invention, n-region 302 may also be put under a forced depletion condition without a corresponding forced depletion in p-region 301, NBD 600. An NBD can have more than one completely depleted region. The difference in the width of p-region 301 creates variations for NBD 600. Other embodiment of the invention is a non-forced depletion condition on n-region 302 with the $w_n$ is equal to $x_n$ and the width of p-region 301 may range from $w_p$ to larger than $x_p$, according to this embodiment. The difference in the width of p-region 301 will create variations for this embodiment. Another embodiment of the invention is a forced depletion condition on n-region 302 with the $w_n$ is smaller than $x_n$ and the width of p-region 301 may range from $w_p$ to larger than $x_p$, according to this embodiment. The difference in the width of p-region 301 will create variations for this embodiment. These variations of NBD are natural breakdown diodes. They are also members of Natural Breakdown Devices (NBDs). An NBD can have more than one completely depleted region. The region(s) can be either forced depletion region(s) or non-forced depletion region(s).

An NBD has one of the p-region 301 or n-region 302 completely depleted under zero biasing. NBD 300 has p-region 301 in a forced depletion condition and an n-region 302 with its width larger than $x_n$. The operations of NBD 300 are explained with respect to an external biasing applied on the NBD 300 under following conditions:

a) When a zero forward bias voltage is applied on NBD (i.e., at zero bias), the input voltage is $V_{IN}$, i.e., $V_{IN} = 0$.
b) When a forward bias voltage is applied on NBD 300 between 0 and $V_S$, i.e., $0 < V_{IN} < V_S$.
c) When a forward bias voltage applied on NBD 300 is equal to $V_S$, i.e., $V_{IN} = V_S$.
d) When a forward bias voltage applied on NBD 300 is between $V_S$ and $V_{th}$, i.e., $V_S < V_{IN} < V_{th}$.
e) When a forward bias voltage applied on NBD 300 is larger than $V_{th}$, i.e., $V_{IN} > V_{th}$.
f) When a reverse bias voltage $V_{IN}$ is applied on NBD 300.

Accordingly, (a) When $V_{IN} = 0$, an electric field with a voltage difference of $V_S$ is created between contact 303 and p-region 301 due to balancing the depletion region with the built in potential between p-region 301 and n-region 302. The electric field draws electrons from contact to 303 to p-region 301, thus creating an electron current from contact 303 to contact 304. The voltage difference between contacts 303 and 304 is $-(V_D-V_S)$, as a result of the voltage drop across the depletion width $V_{FD}$ and the built-in voltage of NBD 300. Here, NBD 300 is capable of conducting a reverse current at zero bias. This current has a magnitude that is significantly greater than the magnitude of a leakage current of a conventional pn-junction diode.

(b) When $0<V_{IN}<V_S$ and $V_{IN}$ is applied at contact 303 on NBD 300, the depletion width in p-region 301 remains the entire width of p-region 301 because $V_{IN}$ is smaller than the voltage difference between contact 303 and p-region 301. As $V_{IN}$ increases, the voltage difference between contact 303 and p-region 301 decreases. NBD 300 has a smaller voltage response to an input voltage change. Thus NBD 300 can respond to a signal change faster than the conventional pn junction. This makes NBD 300 suitable for rectifying high speed signals. Current flows in NBD 300 and the constant output voltage equals to $-(V_D-V_S)$, which may be used to rectify a small signal. Because NBD 300 can covert the small voltages (less than $V_S$) to a larger output voltage $-(V_D-V_S)$. it may also be used to provide a fixed reference voltage and for setting a voltage level.

(c) When $V_{IN}$ reaches $V_S$, no voltage difference exists between contact 303 and p-region 301. The output voltage is $V_D-V_S$. The depletion region voltage $V_{FD}$ is $-(V_D-V_S)$.

(d) When $V_S<V_{IN}<V_{th}$, the depletion widths in both p-region and n-region reduces. At this point, depletion region voltage reduces too. The current in this regime is a small forward leakage current that is proportional to $V_{IN}$. The output voltage is $V_{IN}-V_D$. When $V_{IN}$ is very close to $V_{th}$, the depletion width on NBD 300 is significantly small for current to starts flowing again.

(e) When $V_{IN}>=V_{th}$, NBD 300 conducts current. The voltage difference between the terminals of NBD 300 is $V_{IN}-V_{th}$.

(f) When a reverse bias voltage $V_{IN}$ is applied to NBD 300, the depletion width expands and the voltage difference across NBD 300 is $-(V_D-V_S+V_{IN})$. The depletion width of n-region 302 of NBD 300 increases as the reverse bias voltage increases until n-region 302 is completely depleted. When n-region 302 becomes completely depleted then the current within NBD 300 increases. This increase in current will cause the resistance between contact 303 and p-region 301 and the resistance between contact 304 and n-region 302 to increase.

Figure 1:
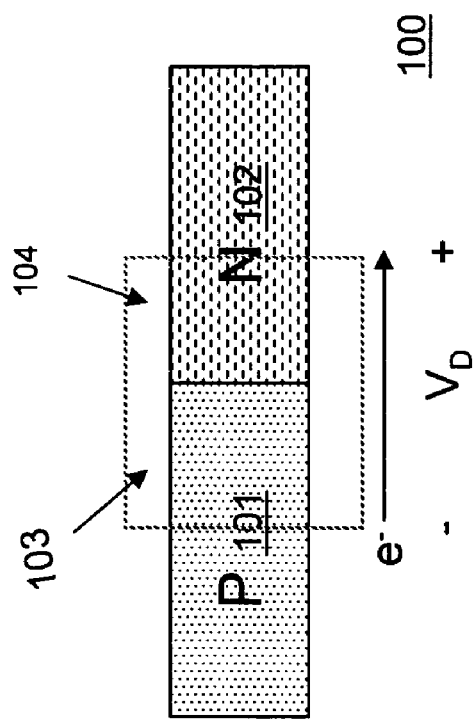
FIG. 1 shows the current (I) versus voltage (V) characteristics of a conventional pn junction diode.
Figure 2:
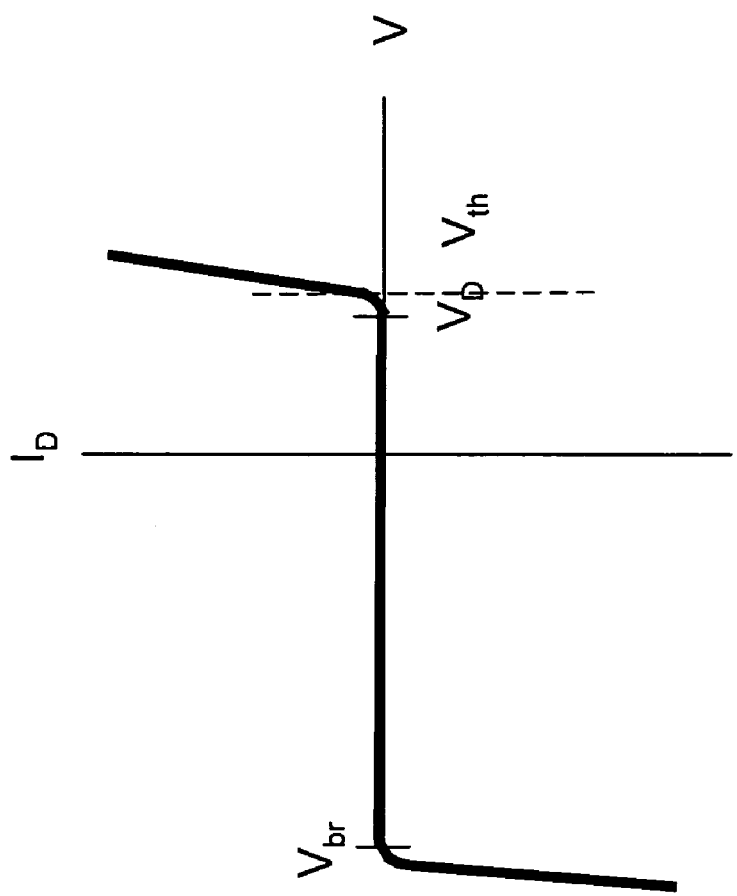
FIG. 2 is a schematic representation of conventional pn junction diode 100.
Figure 4:
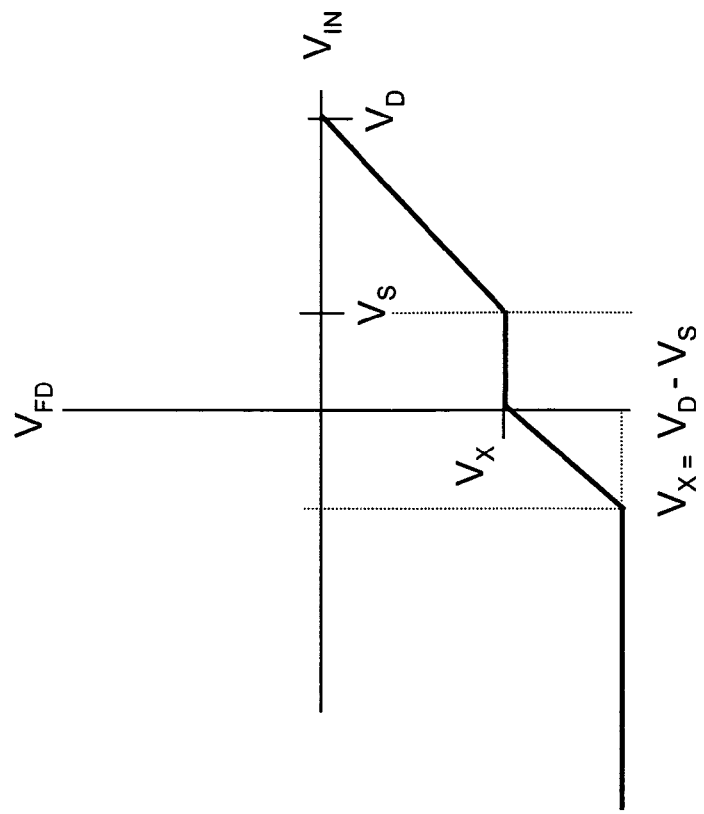
FIG. 4 show the relationship between the built-in voltage $V_{FD}$ and input voltage $V_{IN}$ across NBD 300 during operation.
Figure 5:
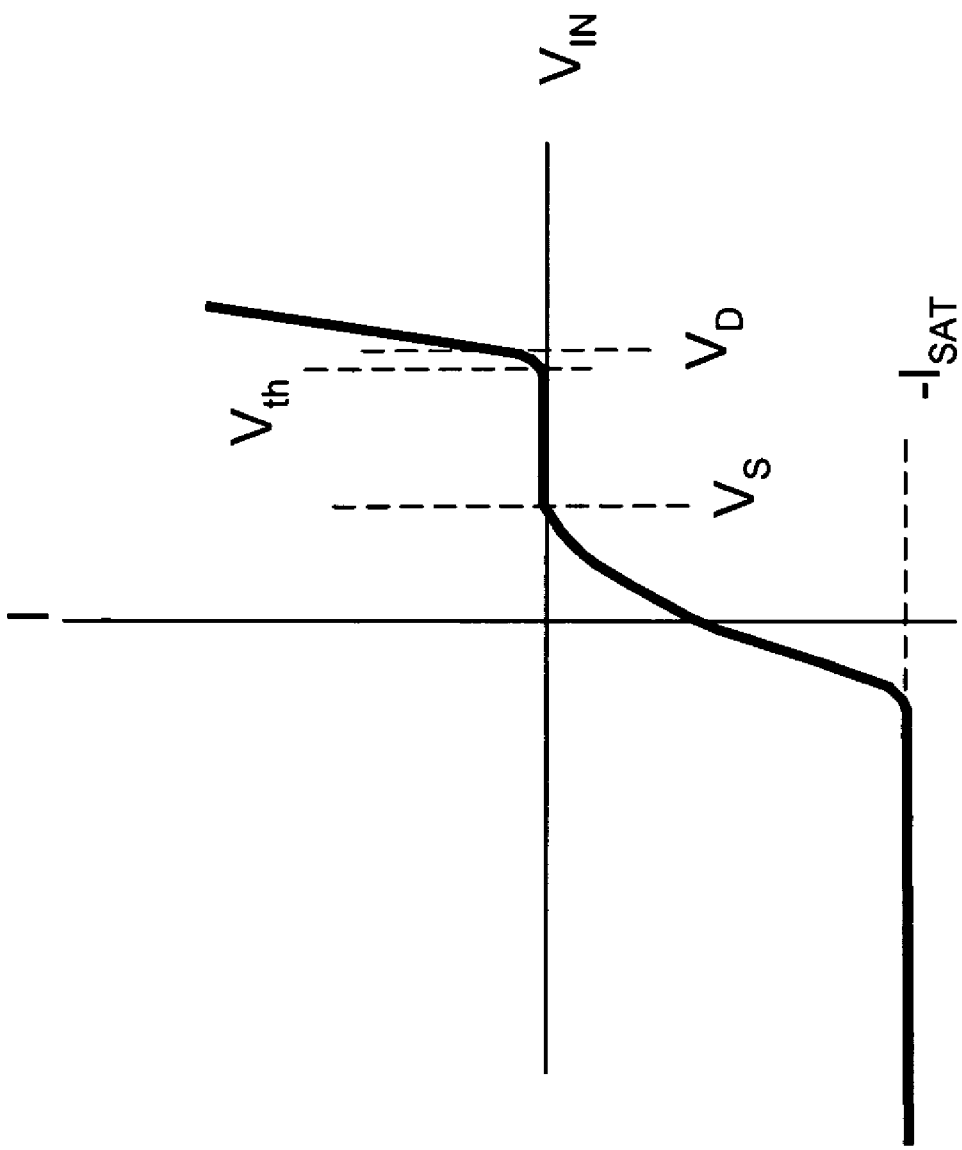
FIG. 5 show the current-voltage (IV) characteristics of NBD 300.

FIG. 5 illustrates the current versus voltage (IV) characteristics of NBD 300. NBD 300 can conduct reverse current when input voltage is smaller than $V_s$, conduct forward current when input voltage is larger than $V_{th}$. When Vs is equal to zero, NBD 300 conduct at zero bias and reverse bias immediately. When $0<V_{IN}<V_s$, a reverse current occurs at forward bias. When Vs is very close to $V_{th}$, NBD 300 can shift from reverse current forward bias mode to forward current forward bias mode within a small voltage range. FIG. 4 shows the relationship between NBD 300 depletion region voltage $V_{FD}$ and the input voltage $V_{IN}$, where the behavior of the depletion width is also shown. NBD 300 converts a small positive input signal when $V_{IN}$ ($0<V_{IN}<V_S$) is applied at contact region 303. This input signal is rectified by NBD 300, creating a fixed output voltage, with a current proportional to the input signal voltage at contact 303. NBD can also rectify small negative input signals ($-V_S<V_{IN}<V_S$). NBD 300 can thus rectify both very high frequency signals, within the regime between 0 volts and $V_S$, and negative voltage signals.

Another embodiment of the present invention has a forced depletion condition on p-region 301 and an n-region 302 with its width less than $x_n$. For the situation when a forced depletion condition is created, the depletion width of n-region 302 covers the whole n-region 302 between contact 304 and complete depleted p-region 301: The behavior of NBD 300 under condition (a) of $V_{IN}=0$ is the same as described above. The behavior of NBD 300 under condition (b) when $0<V_{IN}<V_S$, status is the same as described above until the n-region 302 becomes completely depleted. Once n-region 302 is completely depleted, NBD 300 reaches condition (c) prior to $V_{IN}=V_S$. The behavior of NBD 300 under condition (c) is the same as described above.

Another embodiment according to the present invention has $w_p=x_p$ (or $w_n=x_n$), i.e., the conventional depletion width is the same as the corresponding depletion width of the p-region 301 (or n-region 302). NBD 300 in this configuration is conductive at a zero bias and has the same reverse bias characteristics of an NBD having $w_p<x_p$ (or $w_n<x_n$). However, when applied a forward voltage larger than $V_{th}$, NBD 300 functions like a conventional pn junction diode. If the input voltage is smaller than Vs, a reverse bias current occurs.

To summarize, an NBD of the present invention allows full current flow with a negative, a zero or two positive voltage ranges. The NBD breaks down as if under reverse bias, even though the NBD receives a small forward bias voltage or a reverse bias voltage, so that the NBD conducts current even under a zero bias voltage. This characteristic allows full wave rectification of a sine signal of a small magnitude. The NBD has a fixed output voltage within a certain operation range even when input voltage varies. Within this regime, the NBD has high noise immunity, suitable for use under such application as a power supply.

The built-in voltage in the pn junction of an NBD may be used as a voltage supply. An NBD has a low breakdown voltage. As one side of an NBD is completely depleted, no leakage current is observed even under a reverse bias condition. The built-in electric field provides high conductivity at zero and reverse bias by zeroing the distance for electrons and holes to travel across the pn-junction to the opposite region. When an input voltage $V_{IN}$ satisfies $0<V_{IN}<Vs$, a reverse current can flow when electrons are available.

The NBD may therefore be used as a voltage regulator that has an output voltage that can be set by the specific built-in voltage of the NBD. Such an NBD may use its fixed-output input voltage range to filter noise. Thus, an NBD creates a clean (low power) DC voltage source.

According to another embodiment of the present invention, FIG. 6(a) shows NBD 600 with n-type region 602, rather than a p-type region, having a width $w_n$ that is less than $x_n$–the depletion width of a conventional pn junction diode:

$$w_n \leq x_n = \sqrt{\frac{2\varepsilon_s N_A \phi_i}{q N_D (N_A + N_D)}}$$

A similar determination provides width $w_n$ for NBD 600. The operation of a forced depletion condition with n-region 602 with its depletion band width $w_n<x_n$ and p-region 601 larger or equal to $x_p$ behaves as follows:

At (a) a zero-bias, n-region 602 is under a forced depletion condition, a voltage difference between contacts 603 and 604 is the depletion voltage $V_{FD}$ having value $-(V_D-V_S)$ and NBD 600 is capable of conducting a reverse current. For condition (b), as the voltage increases, the voltage difference between contact 604 and n-region 602 decreases therefore n-region remains completely depleted. The voltage output is $(V_D-V_S)$ volts.

For condition (c), no voltage difference exists between contact 604 and n-region 302, so that the same behavior as described above for NBD 300 is equally applicable.

For conditions (d) and (e), the depletion widths decrease for n-region 602 and p-region 601. In these cases, NBD 600 behaves in the same manner as NBD 300 under these conditions.

For condition (f), the depletion width expands and the voltage difference on NBD 600 is $-(V_D-V_S+V_{IN})$. The depletion width within p-region 601 of NBD 600 increases as the reverse bias voltage increases until p-region 601 is completely depleted. When p-region 601 becomes completely depleted, the current within NBD 600 increases. This increase in current causes the resistance between contact 604 and n-region 602 and the resistance between contact 603 and p-region 601 to increase.

According to one embodiment of the present invention, FIG. 6(b) shows a NBD with two regions (p-region and n-region) which are both under forced depletion condition. According to other embodiments of the present invention, FIGS. 7(a), 7(b) and (c) show different NBD configurations, represented by NBD 700, NBD 710 and NBD 720, each including a region (e.g., 701, 711, 721 or 722) under the forced depletion condition. Also, when region 702 is p-type and region 712 is n-type, then NBD 700 and NBD 710 can be seen as NPN and PNP transistors respectively. FIGS. 8(a), 8(b), 8(c), 8(d) and 8(e) show different NBD configurations 800, 810, 820, 830 and 840 each including a region (e.g., 801, 811, 821, 822, 831, 832, 833, 841, 842, and 843) having two or more doping concentrations under forced depletion conditions. FIGS. 15(a) to 15(d), 16(a) and 16(b) show some of the embodiments of the NBD, according to the present invention.

A single completely depleted p-region or a single completely depleted n-region constitutes another embodiment of the present invention. A single region in forced depletion condition or a single region in non-forced depletion condition constitutes another embodiment of the present invention. Both P-regions and n-regions can be put into forced or non-forced depletion conditions. In accordance with these embodiments, FIGS. 17(a) to 17(d) show some NBDs at a zero-bias with a forced depletion p-region (or n-region) formed adjacent to a Schottky barrier or an ohmic contact. The Schottky barrier or ohmic contact imposes a forced depletion p-region or a forced depletion n-region.

FIG. 18(a) shows NBD 1800 at a zero bias, and conductors 1801 and 1803 which are contacts to allow NBD 1800 to be connected to an electronic circuit. In NBD 1800, n-region 1802 is completely depleted under a forced depletion condition, having a width less than depletion width 1804. The doping concentration in n-region 1802 is sufficiently high such that the junction between conductor 1803 and n-region 1802 is an ohmic contact and conductor 1801 forms a Schottky barrier to n-region 1802. NBD 1800 performs substantially in the manner described above for NBD 600, having the characteristics such as fast switching, conducting at a zero bias, and low forward voltage drop. The forced depletion width described above for the pn junction configuration may be applied to determine the forced depletion width of a completely depleted p-region 1812 (or n-region 1802).

FIG. 18(b) shows NBD 1810 at a zero bias, and conductors 1811 and 1813, which are contacts to allow NBD 1810 to be connected to an electronic circuit. P-region 1812 is completely depleted under a forced depletion condition, so that the width of p-region 1812 is less than depletion widths 1814. The doping concentration in p-region 1812 is sufficiently high, such that the junction between conductor 1813 and p-region 1812 is an ohmic contact, and conductor 1811 forms a Schottky barrier to p-region 1812. NBD 1810 performs substantially in the manner describe above for NBD 300, having characteristics such as fast switching, conducting at zero bias, and low forward voltage drop.

To determine a forced depletion width for NBD 1800, (1) a depletion width $x_n$, built-in voltage $V_D$ and threshold voltage $V_{th}$ of a conventional Schottky diode are determined using an n-region doping concentration at a zero bias, (2) a forward-bias work voltage $V_S$ that is between zero and $V_{th}$ is selected that can be used with Schottky diode 1800, and (3) the depletion width $w_n$ of n-region 1802 is calculated such that, when a forward bias voltage $V_S$ is applied on NBD 1800, n-region 1802 remains depleted with a built-in voltage $V_{FD}$ that is equal to $-V_X$ ($V_X$ is given by $V_X=V_D-V_S$). Regions 1802 and 1812 include, respectively, multiple p-type and n-type sections of different doping concentrations. According to another embodiment of present invention, an NBD may also be formed using three semiconductor regions, one or more of which is completely depleted. For example, all three regions may be completely depleted. A transistor having at least one completely depleted semiconductor region is an NBD within the scope of the present invention, which may used, for example, in conjunction with the rectenna described above.

Figure 19B:
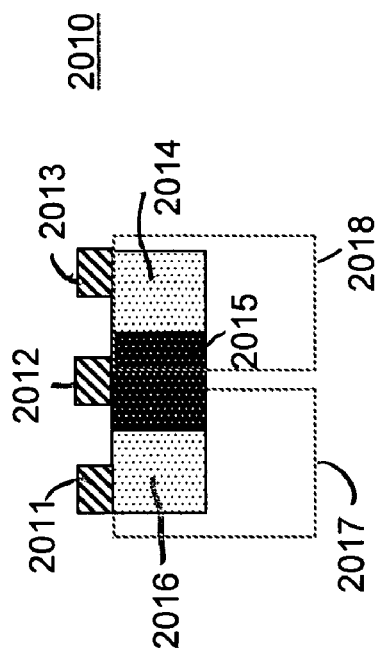
FIG. 19(b) is a schematic representation of NBD 2010 at zero-biasing, according to one embodiment of the present invention; NBD 2010 represents a natural breakdown NPN bipolar transistor having two regions under a forced depletion conditions.
Figure 19A:
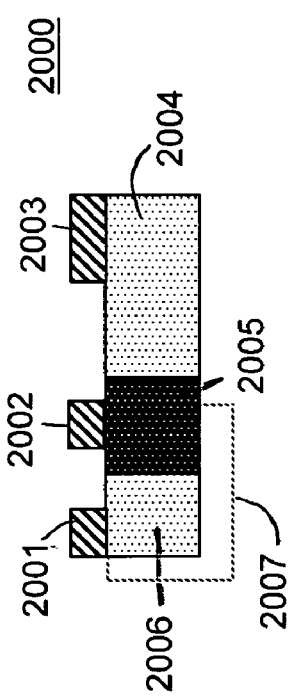
FIG. 19(a) is a schematic representation of NBD 2000 at zero-biasing, according to one embodiment of the present invention; NBD 2000 represents an NPN bipolar transistor with one region under a forced depletion condition.

According to another embodiment of the present invention, FIGS. 19(a) and 19(b) show NPN bipolar transistors 2000 and 2010 with no external voltages being applied. As shown in FIG. 19(a), NPN bipolar transistor 2000 has a completely depleted n-type region 2006 which may function either as an emitter or as a collector for NPN bipolar transistor 2000. FIG. 19(b) shows NPN 2010 having completely depleted n-type regions 2014 and 2016 as an emitter and a collector, respectively. Different transistor characteristics may be achieved using one or more different semiconductor regions that are under a forced or non-forced depletion condition. For example, depleted regions 2006, 2014 and 2016 in NPN transistors 2000 and 2010 may be put under forced or non-forced depletion conditions. Base P-type regions 2005 and 2015 may also be made completely depleted. PNP bipolar transistor structures may also be formed according to principles described for NPN transistors 2000 and 2010 above.

The behaviors of NPN and PNP transistors change when one or more of their semiconductor regions are completed depleted. Using NPN transistor 2000 configured in a common-emitter configuration (i.e. with emitter terminal 2001 grounded) as an example, when emitter region 2006 is completed depleted, a current flows from emitter region 2006 to base region 2005 (i.e. electrons flow from base region 2005 to emitter region 2006) at zero bias. This current affects the cut-off mode operation of NPN transistor 2000, when emitter region 2006 is reversed biased or zero biased relative to base region 2005. Depending on whether or not emitter region 2006 of NPN transistor 2000 is in a forced depleted condition, determines base-to-emitter voltage $V_{BE}$ is in a range that maintains emitter region 2006 completely depleted. Using NPN transistor 2010 configured in a common-emitter configuration, in which both emitter region 2016 and collector region 2014 are both forced depleted and collector contact 2013 is tied to the positive voltage rail, base contact 2012 of NPN transistor 2010 may act as a low-noise reference voltage supply having a voltage level set by the $V_X$ voltage created at the junction between base region 2015 and emitter region 2016. The amount of noise immunity achieved is determined by the predetermined $V_S$ values selected for forced depleted emitter region 2016 and forced depleted collector region 2014.

According to another embodiment of the present invention, four or more regions in different combinations of completely depleted or undepleted semiconductor regions may also be used to form NBDs. Further, whether or not a center semiconductor region may be completely depleted between two completed depleted adjacent semiconductor regions results in different NBDs. Therefore, all variations in an NBD with respect to the semiconductor material types, the numbers of completely depleted regions (whether or not in a forced-depletion condition), the numbers of un-depleted regions, the alignment or orientation of the semiconductor regions, the different doping concentrations are within the scope of the present invention. The forced and non-forced depletion conditions of the present invention can be applied to any device having one or more semiconductor regions that is not completely depleted to modify the behavior for such a device. This may also result in new devices.

In an NBD, when a p-type region is completely depleted at zero-biasing, there is no drift current in it. Therefore, a thermally generated current carrying species of an incompletely depleted region, normally associated with a leakage current, in a conventional pn junction diode does not occur in a completely depleted region. This is because an electric field forces any such electrons to move from the completely depleted p-region to the incompletely depleted region and any such holes to move from the incompletely depleted region to the completely depleted p-region, so that the NBD is conductive at zero bias. In some NBDs, such as a Schottky diode, the contacts to the devices can act as a p-type or n-type region.

FIG. 8(f) shows multiple NBD 600s connected in series in order to create a voltage source with capability of filtering noise, according to application of the present invention. In particular, when input voltage is within the Vs range, the output voltage of an NBD remains constant. Therefore, the output voltage of multiple NBDs connects in series will be significantly higher than the input voltage level of an NBD. Conventional diodes are connected in series for circuit protection, here NBDs are connected in series to create an output voltage magnitude is multiple times of a single NBD output voltage. The output voltage of multiple NBDs connects in parallel will have the same output voltage as the output voltage of one NBD. This is good for regulating the output current flow to prevent the input current to an NBD is larger than the saturation current of an NBD. By varying the number of NBDs and connection types, a variation of the output voltage or current flow control results for different needs is possible.

According to one of the embodiment of present invention, NBD 300 has characteristics as following: (1) low threshold voltage, (2) rectification of small signals (3) rectification of high frequency signals (4) conductivity at zero-bias and (5) fixed output voltage in a selected voltage range. In addition, in a reverse bias mode prior to breakdown, the conducting current of NBD 300 is greater than leakage current, such that the reverse-bias current is significantly greater than that of a conventional diode. With the above characteristics, NBD 300 can filter out the noise of an input signal, and be used in a power supply filter, to create a reference signal. Further, as the built-in voltage raises the output voltage level, NBD 300 indirectly raises the output power. New types of circuits for network switching, digital computing, signaling and waveform shaping (such as clipping and clamping) using NBDs are thus possible. Special diodes using P-type and N-type materials including, Step-Recovery (SRD), PIN and Zener diode types may be created by modifying the depletion widths determined, for example, by the steps described above. By having multiple p-type and n-type regions of different doping concentrations, other diode characteristics such as the saturation current, leakage current and input/output resistance can be created accordingly.

Furthermore, the device in accordance with the present teaching are essentially low noise devices or devices which can operate with a high signal to noise ratio which makes them well suited to uses as detectors in optical communication systems. Drawings and figures for the µM rectenna of the present invention are provided for explanations and do not represent the relationship of connecting parts in scale, size or position. For example, top views of antenna design shown NBDs and electron input/output channels exposing, actual implementations may include other considerations. The figures used for describing the rectenna embodiments in this invention show semiconductor regions disproportionately large and placed in relationship to antennae for explanatory purposes only. It should be understood that adjustments on the rectenna system may be required for obtaining higher packing density or efficiency.

The result of a completely depleted region on a device is that, a device at zero biasing: (1) When a region is completely depleted at zero bias, external electrons near contact will move from completely depleted p-region to n-region and the external positive particle (holes) near contact will move from completely depleted n-region to p-region by the force of electric field created by the depletion region. In this case, the distance between the completely depleted p-region and external electrons near contact is zero, the distance between the completely depleted n-region and external positive particles (holes) near contact is zero. Therefore, by zeroing the distance between external electrons near contact and completely depleted p-region, or the distance between external positive particles (holes) near contact and completely depleted n-region, the zero bias conducting and reverse bias conducting are enabled. (2) If a completely depleted p-region has external electrons near contact or a completely depleted n-region has external positive particles (holes) near contact, the zero bias and reverse bias conductivity will occur. (3) The external electron near contact move against the direction of the force of electric field created by the depletion region, the external positive particles (holes) near contact move toward the same direction of the electrical field force. In example, NBD 300 can conduct at zero and forward bias without overcoming threshold voltage $V_{th}$, like conventional diode.

The present invention is applicable also to rectenna elements other than a dipole rectenna element. Also, the NBD 300 of the present invention can be used with practically any antenna types and size to achieve an EM wave to DC power conversion. For an antenna type in which points of maximum voltages or currents may be determined, and for which a gap may be positioned without affecting the operating EM wave frequency response, a gap with an associated NBD 300 may be placed at one or more of such maximum current points. Otherwise, for such an antenna type, a non-gap or gap-less rectenna element may be used by finding maximum voltage points and at each maximum voltage point along the antenna, place a pair of NBDs to form an input terminal and an output terminal, such as shown in FIGS. 20(a) and 20(b).

Using the parallel and series connection discussed above for connecting dipole rectennae elements into rectenna arrays, a device can be designed to output any voltage with any antenna type. Further, the rectenna elements on each device may be different, so that a single device may be made to capture various frequencies within a large spectrum of EM waves. Also, different portions of a single device may include rectenna elements of different antenna types and these different portions may be used to perform different functions. The present invention is not limited to a dipole rectenna design, nor to the full wave rectifying rectenna described above. In accordance with the embodiments of the invention, each rectenna element can be in any size and any shape and for any type of antenna. In addition, a rectenna array can include more than one type of rectenna elements. For example, in an RFID tag, a portion of a rectenna array may be sensitive to one frequency and is used to capture the EM wave to power the RFID tag circuit, while another portion of the rectenna array may be used for RF transmission and reception. The single plane construction is not limited to contiguous dipoles but is also applicable to the more usual case of separate dipoles. Although the above configurations mentioned only planar arrays, the present invention is applicable also to non-planar arrays. The invention can also be carried out using discrete parts. Because an NBD of the present invention can rectify very high frequency signals, an EM rectenna of the present invention can be used to detect and rectify very high frequency EM waves efficiently. Thus, detection and power conversion from new frequencies in the EM spectrum can now be achieved where previously were impractical or impossible. This includes generating DC power from the IR and visible light spectra (e.g., solar energy) and fast response photosensors for optical sensing and optical networks.

One of the main obstacles preventing the proliferation of solar energy conversion systems is efficiency. The main issue with efficiency is mostly on the rectifiers and the ways that the rectifiers connected to the antenna. The embodiments presented in the EM rectenna of the present invention improve the efficiency of converting electromagnetic (EM) waves to DC electricity over the prior art by providing the improvements in: (1) full wave rectification for a broader input signal frequency range (e.g., frequencies at or above infra-red), (2) solving the voltage drop problems in rectifiers[2], (3) raising the output voltage level for higher efficiency by utilizing special rectifiers that output a higher fixed voltage in response to a small signal, (4) full wave rectification with fewer rectifiers, and (5) providing two sources of input currents, one from the received EM wave and the other one from the electron input channels.

[2] A rectifier (typically a diode) in the prior art requires a bias voltage drop across it before it conducts current. A voltage drop creates power loss, especially for low power signals. The voltage drop issue is important in solar engines, since the voltage drop reduces the voltage supplied to the load.

While only dipole antennae are used to illustrate the rectennae of the present invention, the methods discussed above may be used to incorporate other antenna types and sizes into the rectenna of the present invention.

The detailed description above is provided to illustrate the specific embodiments above and is not intended to be limiting. Numerous modifications and variations within the scope of the present invention are possible. The present invention is set forth in the following claims.

We claim:

1. A rectifying antenna comprising:
   an antenna comprising a continuous conductive plate and having a first location, a second location, a third location and a fourth location on said continuous conductive plate, wherein voltages are induced at the first location and the third location by electromagnetic radiation;
   a current source having a first portion connected to the first location of the antenna and a second portion connected to the third location of the antenna, wherein the current source provides a current to the antenna in response to the induced voltages at the first and third locations of the antenna; and
   a first rectifier connected to the second location of the antenna and a second rectifier connected to the fourth location of the antenna such that the first rectifier and the second rectifier direct the current provided by the current source away from the antenna.

2. A rectifying antenna as in claim 1, wherein the first rectifier and the second rectifier operate under a reverse bias mode such that a majority of carriers in the current provided by the current source and in the current directed away from the antenna by the first rectifier are electrons.

3. A rectifying antenna as in claim 1, wherein the voltage at the first location of the antenna is opposite in polarity relative to the voltage at the third location of the antenna and the voltage at the second location on the antenna is opposite in polarity relative to the voltage at the fourth location.

4. A rectifying antenna as in claim 1, wherein the first rectifier or the second rectifier has a first region connected to the antenna such that the first region is completely depleted at zero bias.

5. A method for providing a rectifying antenna comprising:
   providing an antenna comprising a continuous conductive plate and having a first location, a second location, a third location and a fourth location on said continuous conductive plate, wherein voltages are induced at the first location and the third location by electromagnetic radiation;
   providing a current source having a first portion connected to the first location of the antenna and a second portion connected to the third location of the antenna, wherein the current source provides a current to the antenna in response to the induced voltages at the first and third locations of the antenna; and
   providing a first rectifier connected to the second location of the antenna and a second rectifier connected to the fourth location of the antenna such that the first rectifier and the second rectifier direct the current provided by the current source away from the antenna.

6. A method as in claim 5, wherein the first rectifier and the second rectifier operate under a reverse bias mode such that a majority of carriers in the current provided by the current source and in the current directed away from the antenna by the first rectifier and the second rectifier are electrons.

7. A method as in claim 5, wherein the voltage at the first location of the antenna is opposite in polarity relative to the voltage at the third location of the antenna and the voltage at the second location on the antenna is opposite in polarity relative to the voltage at the fourth location.

* * * * *